(12) United States Patent
Kariya

(10) Patent No.: US 8,164,920 B2
(45) Date of Patent: Apr. 24, 2012

(54) PRINTED WIRING BOARD

(75) Inventor: Takashi Kariya, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 1102 days.

(21) Appl. No.: 11/917,418

(22) PCT Filed: Jun. 13, 2006

(86) PCT No.: PCT/JP2006/311832
§ 371 (c)(1),
(2), (4) Date: Dec. 13, 2007

(87) PCT Pub. No.: WO2006/134914
PCT Pub. Date: Dec. 21, 2006

(65) Prior Publication Data
US 2009/0290316 A1    Nov. 26, 2009

(30) Foreign Application Priority Data

Jun. 13, 2005    (JP) .................................. 2005-172444

(51) Int. Cl.
*H05K 1/11* (2006.01)
*H05K 1/14* (2006.01)
(52) U.S. Cl. ........ 361/794; 361/764; 361/766; 361/784; 361/795
(58) Field of Classification Search .......... 361/764–784, 361/792–795; 174/259–264
See application file for complete search history.

(56) References Cited

U.S. PATENT DOCUMENTS

| | | | |
|---|---|---|---|
| 7,475,175 B2 * | 1/2009 | Klein et al. | 710/100 |
| 7,982,139 B2 * | 7/2011 | Kariya et al. | 174/260 |

| | | | |
|---|---|---|---|
| 2003/0049885 A1 | 3/2003 | Iijima et al. | |
| 2005/0052822 A1 | 3/2005 | Shimizu et al. | |
| 2006/0137905 A1 | 6/2006 | Kariya et al. | |

FOREIGN PATENT DOCUMENTS

| | | |
|---|---|---|
| EP | 1 696 716 A1 | 8/2006 |
| JP | 5-36857 | 2/1993 |
| JP | 8-32197 | 2/1996 |
| JP | 10-4176 | 1/1998 |
| JP | 2001-36253 | 2/2001 |
| JP | 2001-068858 | 3/2001 |
| JP | 2001-326293 | 11/2001 |
| JP | 2001-352141 | 12/2001 |
| JP | 2004-235647 | 8/2004 |
| WO | WO 2005/055684 A1 | 6/2005 |

OTHER PUBLICATIONS

U.S. Appl. No. 11/917,085, filed Dec. 10, 2007, Kariya, et al.

* cited by examiner

*Primary Examiner* — Tuan T Dinh
(74) *Attorney, Agent, or Firm* — Oblon, Spivak, McClelland, Maier & Neustadt, L.L.P.

(57) ABSTRACT

A printed wiring board includes a mounting portion on which a dual core processor including two processor cores in a single chip can be mounted, power supply lines, ground lines, and a first layered capacitor and a second layered capacitor that are independently provided for each of the processor cores, respectively. Accordingly, even when the electric potentials of the processor cores instantaneously drop, an instantaneous drop of the electric potential can be suppressed by action of the layered capacitors corresponding to the processor cores, respectively. In addition, even when the voltage of one of the processor cores varies, the variation in the voltage does not affect the other processor core, and thus malfunctioning does not occur.

15 Claims, 17 Drawing Sheets

PRINTED WIRING BOARD

TECHNICAL FIELD

The present invention relates to a multilayer printed wiring board including a built-up portion in which a plurality of wiring patterns that are stacked with insulating layers therebetween are electrically connected through via holes provided in the insulating layers.

BACKGROUND ART

Hitherto, various types of structures of a printed wiring board including a built-up portion in which a plurality of wiring patterns that are stacked with insulating layers therebetween are electrically connected through via holes provided in the insulating layers have been proposed. For example, in such a printed wiring board, when a semiconductor device mounted is switched between the on and off states at a high speed, switching noise may be generated, resulting in an instantaneous drop in the electric potential of a power supply line. In order to suppress such an instantaneous drop in the electric potential, connection of a capacitor portion between the power supply line and a ground line to perform decoupling has been proposed. In Patent Document 1, provision of a layered capacitor functioning as such a capacitor portion in a printed wiring board has been proposed.
Patent Document 1: Japanese Unexamined Patent Application Publication No. 2001-68858

DISCLOSURE OF INVENTION

Recently, regarding IC chips mounted on a printed wiring board, for the purpose of decreasing the power consumption and improving the system performance, microprocessors in which two or more processor cores are included in a single package, i.e. multicore processors, have been developed. When such a multicore processor is mounted on the printed wiring board disclosed in the above patent application publication, a plurality of processor cores are connected to a common layered capacitor. Therefore, when the voltage of one of the processor cores varies, the variation affects the voltages of the other processor cores, and a problem of malfunctioning easily occurs.

The present invention has been conceived in view of the above problem, and it is an object of the present invention to provide a printed wiring board on which a multicore processor is mounted and in which an instantaneous drop in the electric potential of each processor core can be suppressed, and a variation in the voltage of a processor core does not affect the other processor cores.

In order to achieve at least a part of the above object, the present invention provides the following means.

More specifically, a printed wiring board of the present invention includes:
  a mounting portion on which a multicore processor including a plurality of processor cores in a single chip can be mounted;
  power supply lines which are independently provided for each of the processor cores of the multicore processor;
  ground lines which are independently provided for each of the processor cores of the multicore processor; and
  layered capacitors which are independently provided for each of the processor cores of the multicore processor, and in which one of an upper surface electrode and a lower surface electrode that sandwich a high-dielectric layer is connected to the power supply line of a predetermined processor core and the other of the upper surface electrode and the lower surface electrode is connected to the ground line of the processor core.

In the printed wiring board of the present invention, a power supply line, a ground line, and a layered capacitor are provided for each processor core included in the multicore processor. Accordingly, even when the electric potential of each processor core instantaneously drops, an instantaneous drop in the electric potential can be suppressed by the action of the layered capacitor corresponding to the processor core. Even when the voltage of one of the processor cores varies, the variation in the voltage does not affect the other processor cores. Accordingly, malfunctioning does not occur.

In the printed wiring board of the present invention, the high-dielectric layer is preferably made of a ceramic prepared by sintering a high-dielectric material in advance. In this case, the high-dielectric layer of the layered capacitor connected between the power supply line and the ground line is made of a ceramic. Accordingly, the dielectric constant of the high-dielectric layer can be higher than that of a known dielectric layer made of an organic resin containing an inorganic filler, and thus the capacitance of the layered capacitor can be increased. Accordingly, a satisfactory decoupling effect can be achieved even under a condition that the frequency for switching between the on and off states of a semiconductor device is high, i.e., in the range of several gigahertz to several tens of gigahertz (e.g., 3 GHz to 20 GHz) in which an instantaneous drop in the electric potential easily occurs. In addition, for example, when the printed wiring board includes a built-up portion, since the built-up portion is generally prepared under a temperature condition of 200° C. or lower, it is difficult to sinter a high-dielectric material to form a ceramic layer. Therefore, from this point of view, a ceramic high-dielectric layer prepared by sintering a high-dielectric material in advance separately from the built-up portion is preferably used.

Preferable examples of the high-dielectric layer include, but are not particularly limited to, layers prepared by sintering a raw material containing at least one metal oxide selected from the group consisting of barium titanate ($BaTiO_3$), strontium titanate ($SrTiO_3$), tantalum oxides ($TaO_3$ and $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT).

In the printed wiring board of the present invention, the mounting portion may include, for each of the layered capacitors, pads for an upper surface electrode whose electric potential is the same as that of the upper surface electrode of the layered capacitor and pads for a lower surface electrode whose electric potential is the same as that of the lower surface electrode of the layered capacitor; and the pads for a lower surface electrode corresponding to a predetermined layered capacitor may include directly-connected-type pads for a lower surface electrode each of which is electrically connected to the lower surface electrode via a rod-shaped conductor penetrating through the upper surface electrode of the layered capacitor in a non-contact manner and reaching the lower surface electrode, and indirectly-connected-type pads for a lower surface electrode each of which is electrically connected to the directly-connected-type pads for a lower surface electrode via a connection conductor, rather than via a rod-shaped conductor. In this structure, the number of rod-shaped conductors penetrating through the upper surface electrode, and furthermore, the number of through-holes of the upper surface electrode can be decreased, compared with the case where all of the pads for a lower surface electrode are directly-connected-type pads for a lower surface electrode. As a result, the area of the upper surface electrode can be increased, and the capacitance of the layered capacitor can be increased accordingly.

In the printed wiring board of the present invention, the number of rod-shaped conductors that electrically connect the lower surface electrode to the power supply line or the ground line provided below the lower surface electrode may be smaller than the number of pads for a lower surface electrode. In this structure, the amount of conductors used can be decreased, compared with the case where the number of rod-shaped conductors is the same as the number of pads for a lower surface electrode. Accordingly, the cost can be reduced.

In the printed wiring board of the present invention, the mounting portion may include, for each of the layered capacitors, pads for an upper surface electrode whose electric potential is the same as that of the upper surface electrode of the layered capacitor and pads for a lower surface electrode whose electric potential is the same as that of the lower surface electrode of the layered capacitor; and the number of rod-shaped conductors that penetrate from the upper surface electrode corresponding to a predetermined layered capacitor through the lower surface electrode of the layered capacitor in a non-contact manner and that electrically connect to the power supply line or the ground line provided below the lower surface electrode may be smaller the number of pads for an upper surface electrode. In this structure, the number of rod-shaped conductors penetrating through the lower surface electrode in a non-contact manner, and furthermore, the number of through-holes of the lower surface electrode can be decreased, compared with the case where the number of rod-shaped conductors is the same as the number of pads for an upper surface electrode. As a result, the area of the lower surface electrode can be increased, and the capacitance of the layered capacitor can be increased accordingly. In addition, since the amount of conductors used can be decreased, the cost can also be reduced.

In the printed wiring board of the present invention, the distance between the electrodes of the layered capacitor is preferably 10 μm or less, which is a distance at which short circuits do not substantially occur. In this case, since the distance between the electrodes of the layered capacitor is sufficiently small, the capacitance of the layered capacitor can be increased.

In the printed wiring board of the present invention, each of the layered capacitors is preferably provided directly under the corresponding processor core. In this structure, the electric power can be supplied to each of the processor cores with a short wire length.

The printed wiring board of the present invention may further include chip capacitors which are disposed at the side of a surface having the mounting portion thereon and which are independently connected to each of the layered capacitors. In this structure, when the capacitance is not sufficient only in the layered capacitor, the chip capacitors can compensate for the shortage. As the length of the wiring between a chip capacitor and a processor core increases the decoupling effect decreases. In this case, however, since the chip capacitors are disposed at the side Of the surface having the mounting portion thereon, the length of the wiring between each of the chip capacitors and the corresponding processor core can be small, and thus a decrease in the decoupling effect can be suppressed. Furthermore, since each of the chip capacitors is connected to the corresponding processor core via the layered capacitor, a loss of the power supply from the chip capacitor to the processor core can be decreased.

The printed wiring board of the present invention may further include a stress relief portion which is provided below the mounting portion and which is made of an elastic material. In this structure, even when a stress due to a difference in thermal expansion or the like is generated between the multicore processor mounted on the mounting portion and the printed wiring board except for the stress relief portion, the stress relief portion absorbs the stress, and thus problems such as a decrease in the connection reliability and a decrease in the insulation reliability do not easily occur. When a ceramic is used as the high-dielectric layer of a layered capacitor, cracks are easily generated in the high-dielectric layer because of its small thickness and brittleness. However, the presence of the stress relief portion can prevent the generation of cracks.

In this case, the stress relief portion may be provided in only an area directly under the multicore processor mounted on the mounting portion. A problem of a stress due to a difference in thermal expansion or the like mainly occurs in the area directly under the multicore processor. Therefore, when the stress relief portion is provided on this area, the cost of the material can be reduced.

Examples of the material of the stress relief portion include, but are not particularly limited to, organic resin sheets such as a modified epoxy resin sheet, a polyphenylene ether resin sheet, a polyimide resin sheet, a cyanoester resin sheet, and an imide resin sheet. These organic resin sheets may contain a thermoplastic resin such as a polyolefin resin or a polyimide resin; a thermosetting resin such as a silicone resin; or a rubber resin such as styrene-butadiene rubber (SBR), acrylonitrile-butadiene rubber (NBR), or a urethane. These organic resin sheets may contain fibers, fillers, or flakes made of an inorganic material such as silica, alumina, or zirconia. The stress relief portion preferably has a Young's modulus in the range of 10 to 1,000 MPa. In the case where the Young's modulus of the stress relief portion is within the above range, even when a stress due to a difference in the coefficient of thermal expansion between the semiconductor device mounted on the mounting portion and the layered capacitors is generated, the stress can be relieved.

BEST MODE FOR CARRYING OUT THE INVENTION

[First Embodiment]

Figure 1:
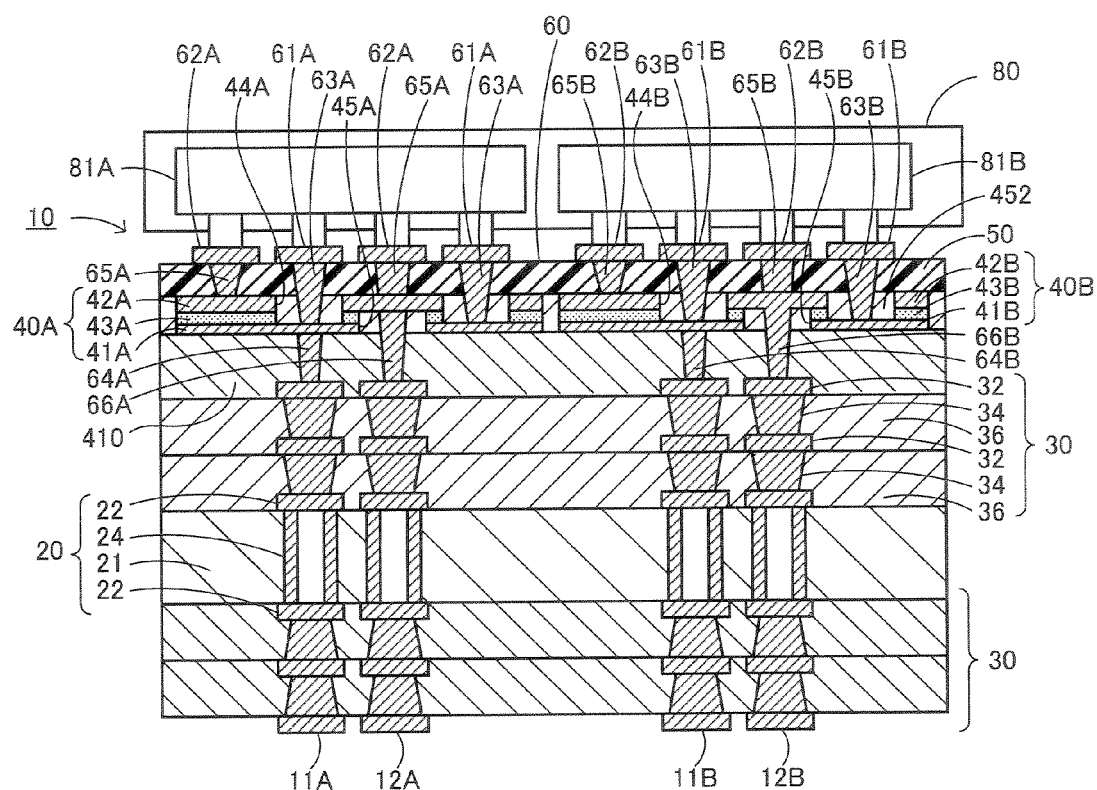
FIG. 1 is a longitudinal cross-sectional view of a multilayer printed wiring board 10.
Figure 2:
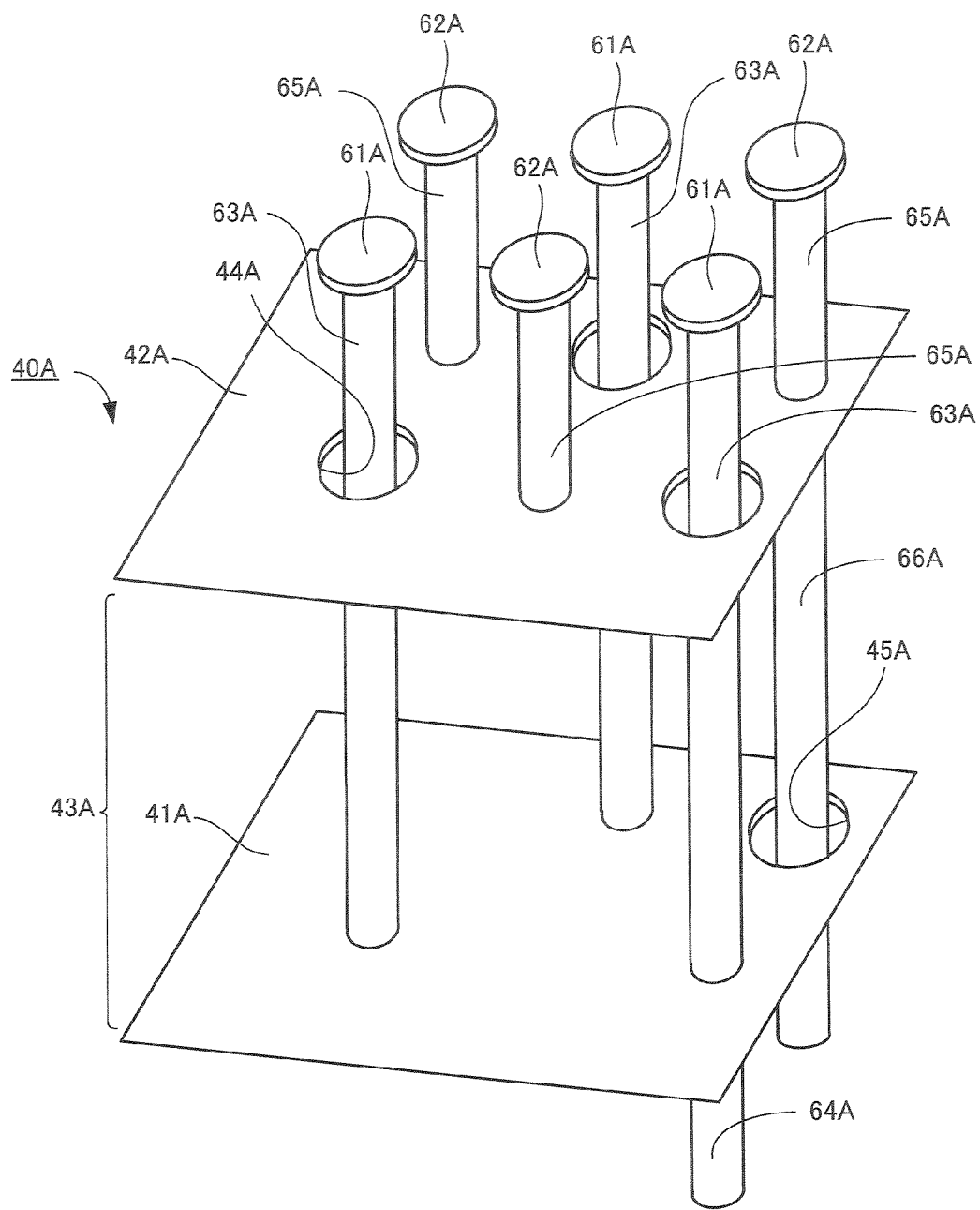
FIG. 2 is a schematic perspective view showing a layered capacitor 40A.
Figure 3:
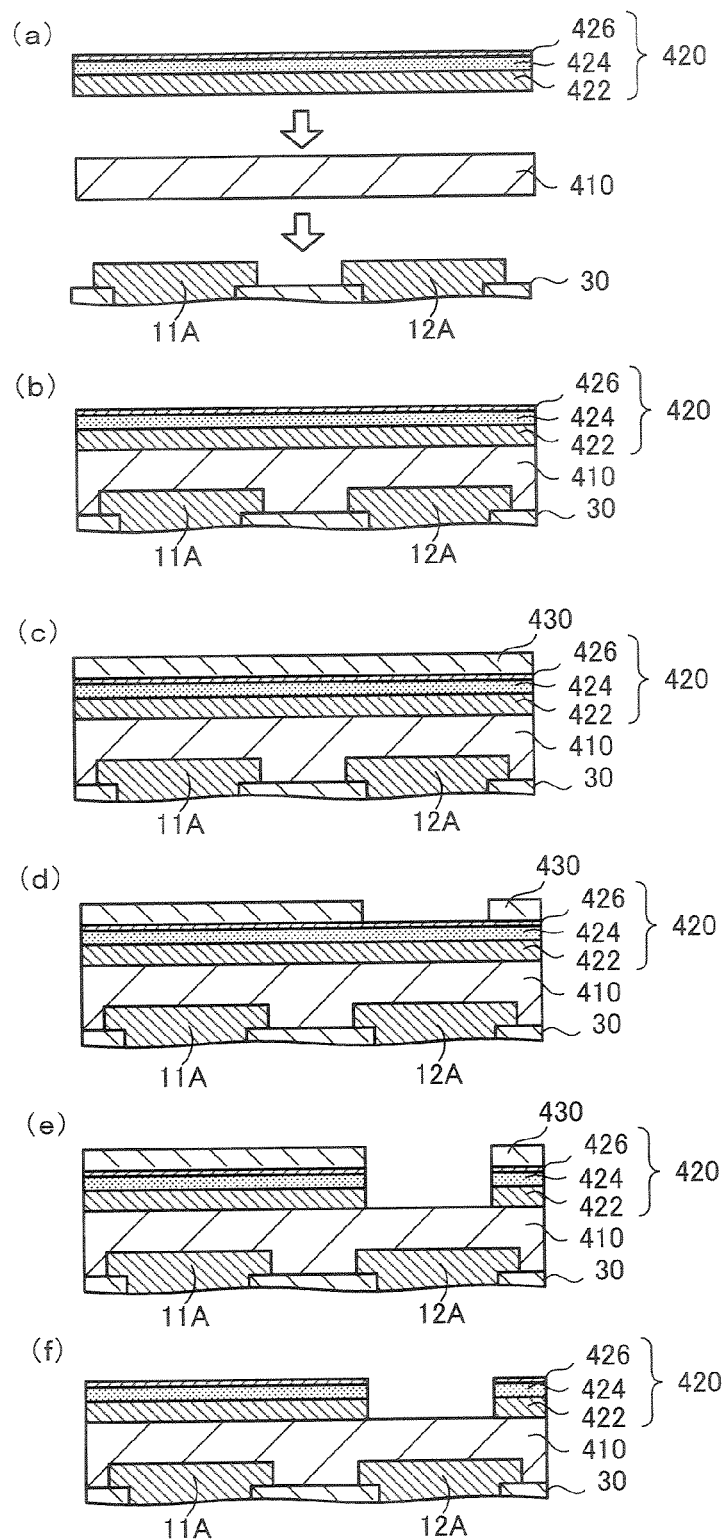
FIG. 3 includes views illustrating a process of producing the multilayer printed wiring board 10.
Figure 4:
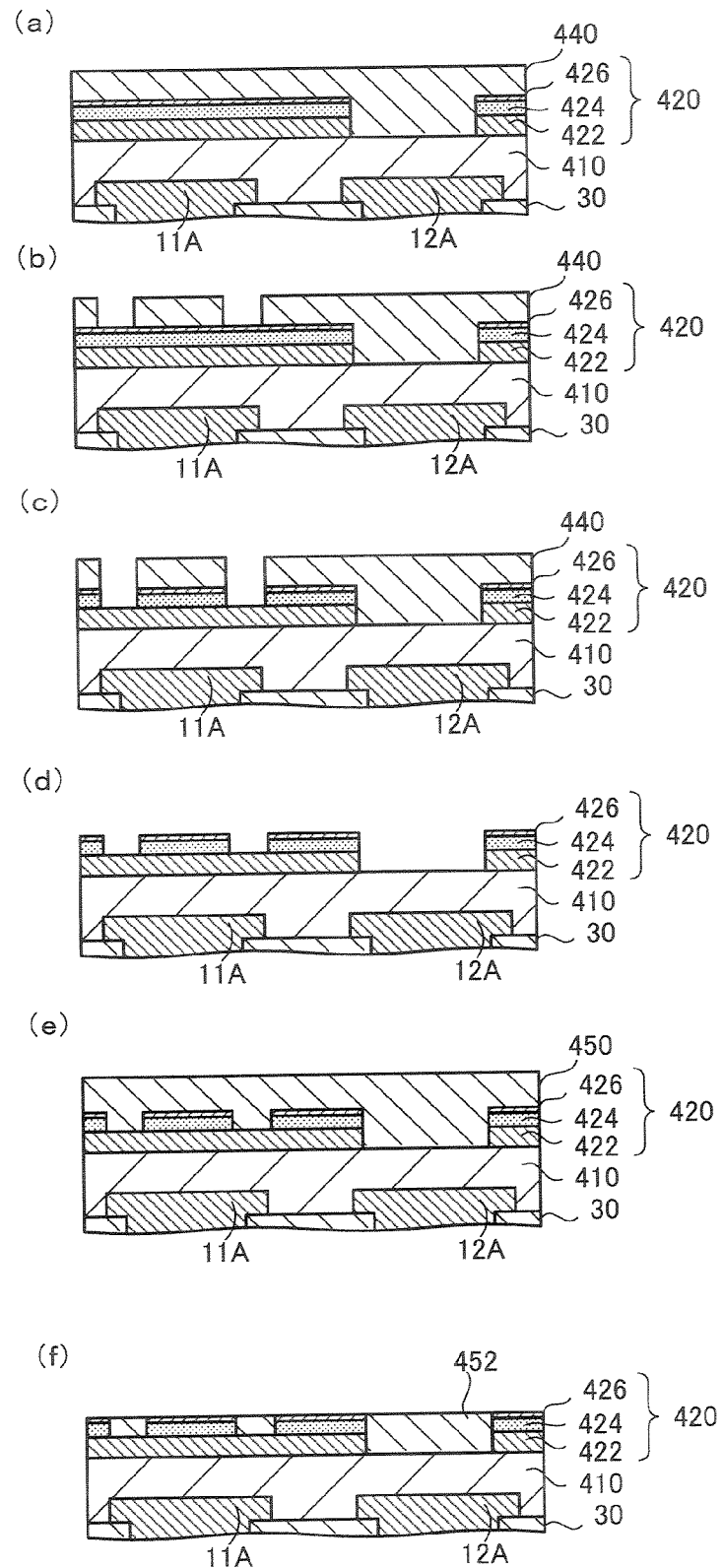
FIG. 4 includes views illustrating the process of producing the multilayer printed wiring board 10.
Figure 5:
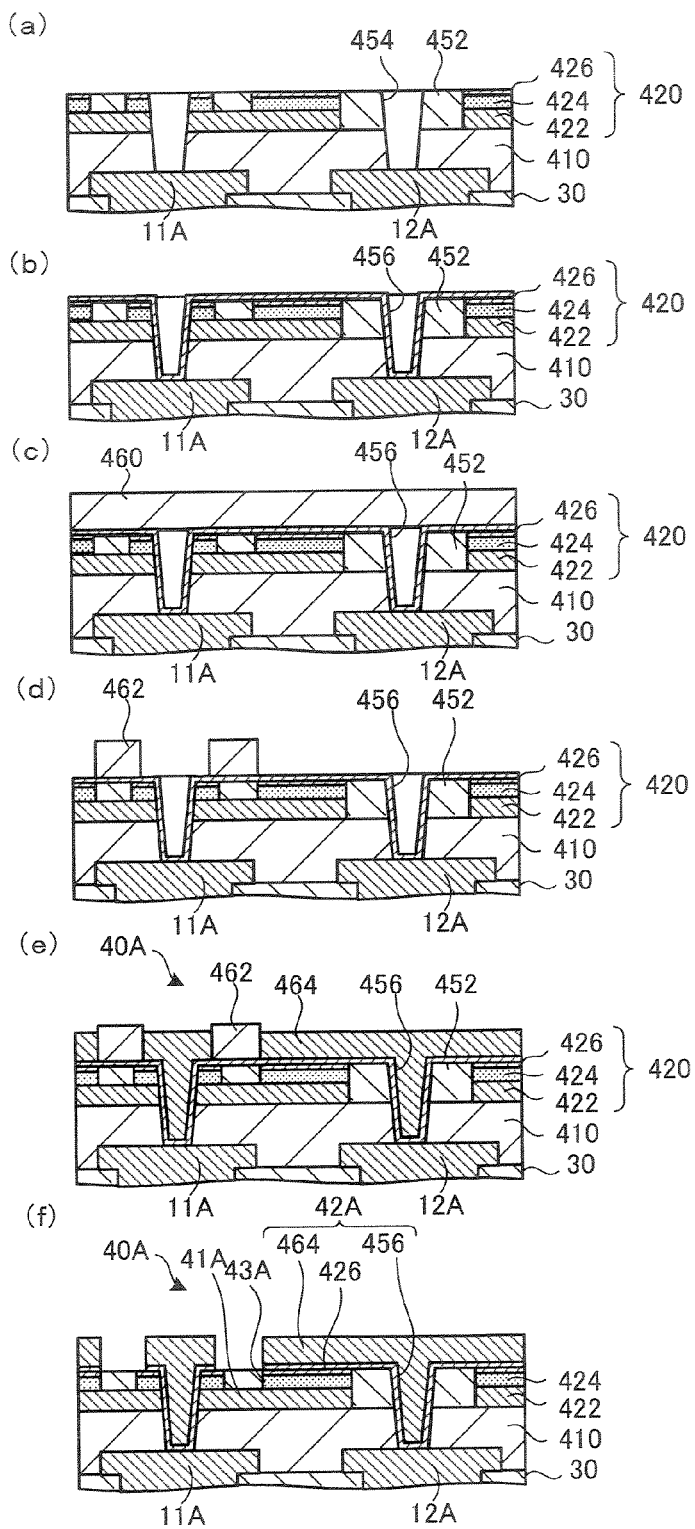
FIG. 5 includes views illustrating the process of producing the multilayer printed wiring board 10.
Figure 6:
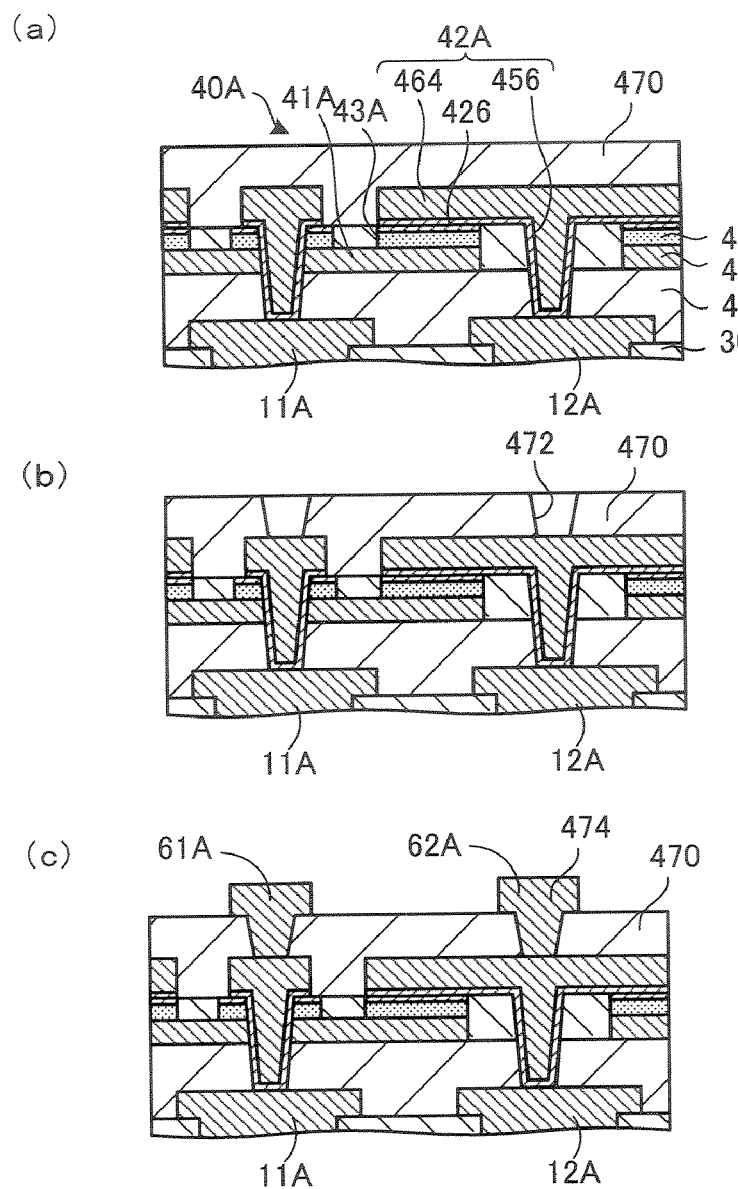
FIG. 6 includes views illustrating the process of producing the multilayer printed wiring board 10.

Embodiments of the present invention will now be described with reference to the drawings. FIG. 1 is a longitudinal cross-sectional view showing the overall structure of a multilayer printed wiring board 10 according to a first embodiment of the present invention. FIG. 2 is a schematic perspective view showing a first layered capacitor 40A.

The multilayer printed wiring board 10 includes a core substrate 20 in which wiring patterns 22 provided on the upper surface and the lower surface of the substrate are electrically connected to each other via through-hole conductors 24; built-up portions 30 in which a plurality of stacked wiring patterns 32 are electrically connected through resin insulating layers 36 through via holes 34, the built-up portions 30 being provided on each surface of the core substrate 20; a layered capacitor 40A which is provided on an interlayer insulating layer 410 provided on the upper surface of one of the built-up portions 30 and which includes a lower surface electrode 41A, an upper surface electrode 42A, and a high-dielectric layer 43A provided between the lower surface electrode 41A and the upper surface electrode 42A; a layered capacitor 40B which is also provided on the interlayer insulating layer 410 and which includes a lower surface electrode 41B, an upper surface electrode 42B, and a high-dielectric layer 43B provided between the lower surface electrode 41B and the upper surface electrode 42B; a stress relief portion 50 made of an elastic material; and a mounting portion 60 on which a dual core processor 80 including a first processor core 81A and a second processor core 81B in a single chip is mounted.

The core substrate 20 includes a core substrate main body 21 composed of a bismaleimide-triazine (BT) resin, a glass-epoxy substrate, or the like; the copper wiring patterns 22 disposed on the upper surface and the lower surface of the core substrate main body 21; and the copper through-hole conductors 24 provided in the inner surfaces of through-holes penetrating through the core substrate main body 21. The wiring patterns 22 are electrically connected to each other via the through-hole conductors 24.

The built-up portions 30 are provided on the upper surface and the lower surface of the core substrate 20 and each include the resin insulating layers 36 and the wiring patterns 32 which are alternately stacked, and the via holes 34 penetrating through the corresponding resin insulating layer 36. Via holes 34 penetrating through first resin insulating layers 36 disposed adjacent to either surface of the core substrate 20 electrically connect the wiring pattern 22 disposed on a surface of the core substrate 20 to the wiring pattern 32 disposed on the surface of the corresponding first resin insulating layer 36. Via holes 34 penetrating through second resin insulating layers 36 disposed on either of the above first resin insulating layers 36 electrically connect the wiring pattern 32 disposed on a surface of the first resin insulating layer 36 to the wiring pattern 32 disposed on a surface of the corresponding second resin insulating layers 36. The built-up portions 30 are formed by a known subtractive process or additive process (such as a semi-additive process or a full-additive process).

A first ground line 11A corresponding to the first processor core 81A and a second ground line 11B corresponding to the second processor core 81B are independently provided on the core substrate 20 and the built-up portions 30. A first power supply line 12A corresponding to the first processor core 81A and a second power supply line 12B corresponding to the second processor core 81B are independently provided. In addition to these power supply lines and ground lines, signal lines are also provided in the multilayer printed wiring board 10. However, the signal lines are not shown in FIG. 1.

As shown in FIGS. 1 and 2, the first layered capacitor 40A is provided so as to correspond to the first processor core 81A. The first layered capacitor 40A includes the lower surface electrode 41A, the upper surface electrode 42A, and the high-dielectric layer 43A provided between the lower surface electrode 41A and the upper surface electrode 42A. The high-dielectric layer 43A is produced by sintering a ceramic high-dielectric material at a high temperature. Among these, the lower surface electrode 41A is provided on the lower surface of the high-dielectric layer 43A and is a copper electrode having a solid pattern. The lower surface electrode 41A is electrically connected to each ground pad 61A through a rod-shaped conductor 63A that passes through a through-hole 44A of the upper surface electrode 42A in a non-contact manner so that the lower surface electrode 41A and the ground pads 61A of the first processor core 81A have the same electric potential. The lower surface electrode 41A is electrically connected to the ground line 11A provided below the lower surface electrode 41A through a rod-shaped conductor 64A penetrating through the interlayer insulating layer 410 in the vertical direction. Here, the lower surface electrode 41A is connected so as to have the same electric potential as that of each of the ground pads 61A. Accordingly, when at least one rod-shaped conductor 63A and at least one rod-shaped conductor 64A are formed, all of the ground pads 61A can be connected to the ground line 11A. On the other hand, the upper surface electrode 42A is provided on the upper surface of the high-dielectric layer 43A and is a copper electrode having a solid pattern. The upper surface electrode 42A is electrically connected to each power supply pad 62A through a rod-shaped conductor 65A so that the upper surface electrode 42A and the power supply pads 62A of the first processor core 81A on the mounting portion 60 have the same electric potential. The upper surface electrode 42A is electrically connected to the power supply line 12A provided below the upper surface electrode 42A through a rod-shaped conductor 66A that passes through a through-hole 45A of the lower surface electrode 41A in a non-contact manner and that penetrates through the interlayer insulating layer 410 in the vertical direction. Here, the upper surface electrode 42A is connected so as to have the same electric potential as that of each of the power supply pads 62A. Accordingly, when at least one rod-shaped conductor 66A is formed, all of the power supply pads 62A can be connected to the power supply line 12A. The distance between the lower surface electrode 41A and the upper surface electrode 42A is 10 μm or less, which is a distance at which short circuits do not substantially occur. The high-dielectric layer 43A is produced by forming a thin film of a high-dielectric material containing at least one metal oxide selected from the group consisting of $BaTiO_3$, $SrTiO_3$, $TaO_3$, $Ta_2O_5$, PZT, PLZT, PNZT, PCZT, and PSZT so as to have a thickness in the range of 0.1 to 10 µm, and then sintering the thin film to form a ceramic layer. The thickness of the high-dielectric layer 43A is 10 µm or less and determined so that the lower surface electrode 41A and the upper surface electrode 42A are not substantially short-circuited.

As shown in FIG. 1, the second layered capacitor 40B is provided so as to correspond to the second processor core 81B. The second layered capacitor 40B includes the lower surface electrode 41B, the upper surface electrode 42B, and the high-dielectric layer 43B provided between the lower surface electrode 41B and the upper surface electrode 42B. The high-dielectric layer 43B is produced by sintering a ceramic high-dielectric material at a high temperature. Among these, the lower surface electrode 41B is provided on the lower surface of the high-dielectric layer 43B and is a copper electrode having a solid pattern. The lower surface electrode 41B is electrically connected to each ground pad 61B through a rod-shaped conductor 63B that passes through a through-hole 44B of the upper surface electrode 42B in a non-contact manner so that the lower surface electrode 41B and the ground pads 61B of the second processor core 81B on the mounting portion 60 have the same electric potential. The lower surface electrode 41B is electrically connected to the ground line 11B provided below the lower surface electrode 41B through a rod-shaped conductor 64B penetrating through the interlayer insulating layer 410 in the vertical direction. Here, the lower surface electrode 41B is connected so as to have the same electric potential as that of each of the ground pads 61B. Accordingly, when at least one rod-shaped conductor 63B and at least one rod-shaped conductor 64B are formed, all of the ground pads 61B can be connected to the ground line 11B. On the other hand, the upper surface electrode 42B is provided on the upper surface of the high-dielectric layer 43B and is a copper electrode having a solid pattern. The upper surface electrode 42B is electrically connected to each power supply pads 62B through a rod-shaped conductor 65B so that the upper surface electrode 42B and the power supply pads 62B of the second processor core 81B on the mounting portion 60 have the same electric potential. The upper surface electrode 42B is electrically connected to the power supply line 12B provided below the upper surface electrode 42B through a rod-shaped conductor 66B that passes through a through-hole 45B of the lower surface electrode 41B in a non-contact manner and that penetrates through the interlayer insulating layer 410 in the vertical direction. Here, the upper surface electrode 42B is connected so as to have the same electric potential as that of each of the power supply pads 62B. Accordingly, when at least one rod-shaped conductor 66B is formed, all of the power supply pads 62B can be connected to the power supply line 12B. The distance between the lower surface electrode 41B and the upper surface electrode 42B is 10 µm or less, which is a distance at which short circuits do not substantially occur. The high-dielectric layer 43B is produced by forming a thin film of a high-dielectric material containing at least one metal oxide selected from the group consisting of $BaTiO_3$, $SrTiO_3$, $TaO_3$, $Ta_2O_5$, PZT, PLZT, PNZT, PCZT, and PSZT so as to have a thickness in the range of 0.1 to 10 µm, and then sintering the thin film to form a ceramic layer. The thickness of the high-dielectric layer 43B is 10 µm or less and determined so that the lower surface electrode 41B and the upper surface electrode 42B are not substantially short-circuited. The second layered capacitor 40B also has the structure shown in the perspective view of FIG. 2.

The through-holes 44A, 44B, 45A, and 45B of the first layered capacitor 40A and the second layered capacitor 40B, and the periphery of the through-holes are filled with a layer 452 filling between the high-dielectric layers.

The stress relief portion 50 is made of an elastic material. Examples of the elastic material include, but are not particularly limited to, organic resin sheets such as a modified epoxy resin sheet, a polyphenylene ether resin sheet, a polyimide resin sheet, a cyanoester resin sheet, and an imide resin sheet. These organic resin sheets may contain a thermoplastic resin such as a polyolefin resin or a polyimide resin; a thermosetting resin such as a silicone resin; or a rubber resin such as SBR, NBR, or a urethane. These organic resin sheets may also contain fibers, fillers, or flakes made of an inorganic material such as silica, alumina, or zirconia. The stress relief portion 50 preferably has a low Young's modulus in the range of 10 to 1,000 MPa. In the case where the Young's modulus of the stress relief portion 50 is within the above range, even when a stress due to a difference in the coefficient of thermal expansion between the semiconductor device mounted on the mounting portion 60 and the layered capacitors is generated, the stress can be relieved. The rod-shaped conductors 63A and 65A are provided so as to penetrate through the stress relief portion 50 in the vertical direction.

The mounting portion 60 is an area on which the dual core processor 80 is mounted and is provided on the surface of the multilayer printed wiring board 10. Ground pads 61A and power supply pads 62A that are corresponding to the first processor core 81A of the dual core processor 80 are provided on the mounting portion 60, and ground pads 61B and power supply pads 62B that are corresponding to the second processor core 81B of the dual core processor 80 are also provided on the mounting portion 60. The ground pads 61A and the power supply pads 62A are arranged in a grid pattern or a checkered pattern near the center in plan view of the mounting portion 60. Similarly, the ground pads 61B and the power supply pads 62B are arranged in a grid pattern or a checkered pattern near the center in plan view of the mounting portion 60. Pads (not shown) for a signal are arranged around the pads 61A, 62A, 61B, and 62B in a grid pattern, a checkered pattern, or at random. The ground pads 61A and the power supply pads 62A are preferably alternately arranged, and similarly, the ground pads 61B and the power supply pads 62B are preferably alternately arranged. In such a case, the loop inductance is decreased, and an instantaneous drop in the electric potential of the power supply can be easily prevented.

An example of the use of the multilayer printed wiring board 10 having the above structure will now be described. First, a dual core processor 80 in which a large number of solder bumps are arranged on the reverse face is placed on the mounting portion 60. In this step, terminals for a ground and terminals for a power supply of the first processor core 81A are brought into contact with the ground pads 61A and the power supply pads 62A of the mounting portion 60, respectively. Terminals for a ground and terminals for a power supply of the second processor core 81B are brought into contact with the ground pads 61B and the power supply pads 62B of the mounting portion 60, respectively. Subsequently, each terminal is bonded with the solder by a reflow process. The multilayer printed wiring board 10 is then bonded to another printed wiring board such as a motherboard. In this case, solder bumps are formed in advance on pads provided on the reverse face of the multilayer printed wiring board 10. The multilayer printed wiring board 10 is bonded to the other printed wiring board by a reflow process while the solder bumps are in contact with corresponding pads provided on the other printed wiring board. The ground line 11A corresponding to the first processor core 81A and the ground line 11B corresponding to the second processor core 81B are independently arranged on the other printed wiring board such as a motherboard. The power supply line 12A corresponding to the first processor core 81A and the power supply line 12B corresponding to the second processor core 81B are also independently arranged on the other printed wiring board such as a motherboard. In such a case, even if the electric potential of one of the first processor core 81A and the second processor core 81B instantaneously drops, an instantaneous drop in the electric potential can be suppressed by the action of the corresponding layered capacitor 40A or 40B. Even if the voltage of one of the first processor core 81A and the second processor core 81B varies, the variation in the voltage does not affect the other processor core. Accordingly, malfunctioning does not easily occur.

Next, a process of producing the multilayer printed wiring board 10 of this embodiment will be described. A process of preparing the core substrate 20 and the built-up portions 30 is known, and the first layered capacitor 40A and the second layered capacitor 40B have the same structure. Therefore, a process of preparing the first layered capacitor 40A and the stress relief portion 50 will now be mainly described. FIGS. 3 to 6 include views illustrating this process.

First, as shown in FIG. 3(a), a core substrate having a built-up portion 30 thereon was prepared. An interlayer insulating layer 410 was bonded onto the built-up portion 30 with a vacuum laminator under laminating conditions at a temperature in the range of 50° C. to 150° C. and at a pressure in the range of 0.5 to 1.5 MPa. A first ground line 11A and a first power supply line 12A were provided on the built-up portion 30. In addition, a second ground line 11B and a second power supply line 12B (not shown) which were independent from the first ground line 11A and the first power supply line 12A, respectively, also provided on the built-up portion 30. Subsequently, a high-dielectric sheet 420 prepared in advance was bonded onto the interlayer insulating layer 410 with a vacuum laminator under laminating conditions at a temperature in the range of 50° C. to 150° C. and at a pressure in the range of 0.5 to 1.5 MPa. Curing was then performed at 150° C. for three hours (see FIG. 3(b)). The high-dielectric sheet 420 was prepared as follows. Specifically, a high-dielectric material containing at least one metal oxide selected from the group consisting of $BaTiO_3$, $SrTiO_3$, $TaO_3$, $Ta_2O_5$, PZT, PLZT, PNZT, PCZT, and PSZT was printed on a copper foil 422 (which was formed into a lower surface electrode 41A in subsequent steps) having a thickness of 12 μm with a printing device such as a roll coater or a doctor blade so as to form a thin film having a thickness in the range of 0.1 to 10 μm, thus forming an unsintered layer. After the printing, this unsintered layer was sintered in vacuum or a non-oxidizing atmosphere such as a $N_2$ gas atmosphere in a temperature range of 600° C. to 950° C. to form a high-dielectric layer 424. Subsequently, a layer of a metal such as copper, platinum, or gold was formed on the high-dielectric layer 424 using a vacuum deposition system such as a sputtering system. Furthermore, a layer of a metal such as copper, nickel, or tin having a thickness of about 10 μm was formed on the metal layer by electrolytic plating or the like, thereby forming an upper metal layer 426 (which was formed into a part of an upper surface electrode 42A in subsequent steps). Consequently, the high-dielectric sheet 420 was obtained.

Subsequently, a commercially available dry film 430 was applied on the resulting substrate having the high-dielectric sheet 420 thereon (see FIG. 3(c)). A pattern of the high-dielectric sheet 420 was formed by performing exposure and development (see FIG. 3(d)), etching (see FIG. 3(e)), and removal of the dry film (see FIG. 3(f)), which are normally performed during the formation of a pattern of a multilayer printed wiring board. An etchant containing cupric chloride was used in the etching process.

A dry film 440 was again applied on the substrate on which the high-dielectric sheet 420 was patterned (see FIG. 4(a)). A pattern of the metal layer 426 and the high-dielectric layer 424 of the high-dielectric sheet 420 was formed by performing exposure and development (see FIG. 4(b)), etching (see FIG. 4(c)), and removal of the dry film (see FIG. 4(d)) An etchant containing cupric chloride was used in the etching process. The etching process was performed within a short time such that the metal layer 426 and the high-dielectric layer 424 were completely etched, and the copper foil 422 was then slightly etched.

Next, a resin 450 for filling between layers was filled on the substrate on which the metal layer 426 and the high-dielectric layer 424 were patterned using a squeegee (see FIG. 4(e)) and dried at 100° C. for 20 minutes. In this embodiment, the resin 450 for filling between layers was prepared by charging 100 parts by weight of a bisphenol F-type epoxy monomer (manufactured by Yuka-Shell Epoxy Co., Ltd., molecular weight: 310, trade name: YL983U), 72 parts by weight of spherical $SiO_2$ particles (manufactured by Adtec Co., Ltd., trade name: CRS1101-CE) having an average particle diameter of 1.6 μm and a maximum particle diameter of 15 μm or less, the surfaces of which were coated with a silane coupling agent, and 1.5 parts by weight of a leveling agent (manufactured by San Nopco Limited., trade name: Perenol S4) in a container, and mixing these components by stirring. At that time, the viscosity of the mixture was in the range of 30 to 60 Pa/s at 23° C.±1° C. In addition, 6.5 parts by weight of an imidazole curing agent (manufactured by Shikoku Chemicals Corporation, trade name: 2E4MZ-CN) was used as a curing agent. After the resin 450 was filled and dried, the surface of the resulting substrate was planarized by being polished until the surface of the upper metal layer 426 of the high-dielectric sheet 420 was exposed. Subsequently, a heat treatment was performed at 100° C. for one hour and at 150° C. for one hour to cure the resin 450. Thus, a layer 452 filling between the high-dielectric layers was formed (see FIG. 4(f)).

Subsequently, through-holes 454 reaching the surface of a wiring pattern 32 of the built-up portion 30 were formed at predetermined positions of the substrate having the layer 452 filling between the high-dielectric layers thereon using a carbon dioxide gas laser, a UV laser, a YAG laser, an excimer laser, or the like (see FIG. 5(a)). Subsequently, a catalyst for electroless plating was applied on the surface of the substrate, and the substrate was then immersed in an aqueous solution for electroless copper plating. Accordingly, an electroless copper plating film 456 having a thickness in the range of 0.6 to 3.0 μm was formed on the inner wall of the through-holes 454, the surface of the high-dielectric sheet 420, and the surface of the layer 452 filling between the high-dielectric layers (see FIG. 5(b)). An aqueous electroless plating solution containing 0.03 mol/L copper sulfate, 0.200 mol/L EDTA, 0.1 g/L HCHO, 0.1 mol/L NaOH, 100 mg/L α,α'-bipyridyl, and 0.1 g/L polyethylene glycol (PEG) was used.

Next, a commercially available dry film 460 was applied on the electroless copper plating film 456 (see FIG. 5(c)). The dry film 460 was then exposed, developed, and etched to form a plating resist 462 (see FIG. 5(d)). Subsequently, an electrolytic copper plating film 464 having a thickness of 25 μm was then formed on the exposed surface on which the plating resist 462 was not formed (see FIG. 5(e)). An electrolytic copper plating solution containing 200 g/L sulfuric acid, 80 g/L copper sulfate, and 19.5 mL/L additive (manufactured by Atotech Japan, Capalacid GL) was used. The electrolytic copper plating was performed for 115 minutes under the conditions at a current density of 1 A/dm² and at a temperature of 23° C.±2° C. The dry film 460 was then removed. The exposed portions of the electroless copper plating film 456 and the upper metal layer 426 of the high-dielectric sheet 420, which were disposed under areas where the dry film 460 remained, i.e., which were disposed between the electrolytic copper plating films 464, were removed by etching with an etchant containing sulfuric acid and hydrogen peroxide (see FIG. 5(f)). By performing the above steps, a first layered capacitor 40A was formed on the built-up portion 30. More specifically, the copper foil 422 corresponds to the lower surface electrode 41A. The high-dielectric layer 424 corresponds to the high-dielectric layer 43A. The upper metal layer 426, the electroless copper plating film 456, and the electrolytic copper plating film 464 correspond to the upper surface electrode 42A. A second layered capacitor 40B was also formed in parallel with the first layered capacitor 40A.

Next, the substrate having the electrolytic copper plating film 464 was subjected to a blackening treatment using an aqueous solution containing NaOH (10 g/L), NaClO₂ (40 g/L), and Na₃PO₄ (6 g/L) as a blackening bath (oxidation bath). The substrate was also subjected to a reduction treatment using an aqueous solution containing NaOH (10 g/L) and NaBH₄ (6 g/L) as a reduction bath. Thus, a roughened surface was formed on the surface of the electrolytic copper plating film 464 (not shown). A resin insulating sheet 470 was applied on the first layered capacitor 40A and the second layered capacitor 40B (not shown) with a vacuum laminator under laminating conditions at a temperature in the range of 50° C. to 150° C. and at a pressure in the range of 0.5 to 1.5 MPa and was then cured at 150° C. for three hours (see FIG. 6(a)). The resin insulating sheet 470 is a modified epoxy resin sheet, a polyphenylene ether resin sheet, a polyimide resin sheet, a cyanoester resin sheet, or an imide resin sheet. The resin insulating sheet 470 may contain a thermoplastic resin such as a polyolefin resin or a polyimide resin; a thermosetting resin such as a silicone resin; or a rubber resin such as SBR, NBR, or a urethane. Fibers, fillers, or flakes made of an inorganic material such as silica, alumina, or zirconia may also be dispersed in the resin insulating sheet 470. The resin insulating sheet 470 preferably has a Young's modulus in the range of 10 to 1,000 MPa. When the Young's modulus of the resin insulating sheet 470 is within the above range, a stress caused by the difference in the coefficient of thermal expansion between the dual core processor 80 and the multilayer printed wiring board 10 can be relieved.

Through-holes 472 having a diameter of 65 µm were then formed in the resin insulating sheet 470 using a CO₂ laser via a mask diameter of 1.4 mm, at an energy density of 2.0 mj, and a number of shots of two (see FIG. 6(b)). The substrate was then immersed in a solution containing 60 g/L permanganic acid at 80° C. for 10 minutes to roughen the surface of the resin insulating sheet 470. Subsequently, the substrate after the roughening treatment was immersed in a neutralizing solution (manufactured by Shipley Company, trade name: Circuposit MLB Neutralizer) and was then washed with water. Furthermore, the substrate was immersed in a catalyst solution containing palladium chloride (PbCl₂) and stannous chloride (SnCl₂), thus allowing palladium metal to be precipitated. Accordingly, a palladium catalyst was applied on the surface (including the inner walls of the through-holes 472) of the resin insulating sheet 470. The substrate was then immersed in an aqueous electroless copper plating solution and treated at a solution temperature of 34° C. for 40 minutes. Accordingly, an electroless copper plating film (not shown) having a thickness in the range of 0.6 to 3.0 µm was formed on the surface of the resin insulating sheet 470 and the inner walls of the through-holes 472. An aqueous electroless copper plating solution containing 0.03 mol/L copper sulfate, 0.200 mol/L EDTA, 0.1 g/L HCHO, 0.1 mol/L NaOH, 100 mg/L α,α'-bipyridyl, and 0.1 g/L polyethylene glycol (PEG) was used. A dry film was formed on the electroless copper plating film, and an electrolytic copper plating film having a thickness of 25 µm was then formed under the following conditions (not shown). An electrolytic copper plating solution containing 200 g/L sulfuric acid, 80 g/L copper sulfate, and 19.5 mL/L additive (manufactured by Atotech Japan, Capalacid GL) was used. The electrolytic copper plating was performed for 115 minutes under the conditions at a current density of 1 A/dm² and at a temperature of 23° C.±2° C. The dry film was then removed, and thus the multilayer printed wiring board 10 shown in FIG. 1 was obtained (see FIG. 6(c)). Here, the resin insulating sheet 470 corresponds to the stress relief portion 50. The upper parts of the copper plating film 474 filling the through-holes 472 correspond to the ground pads 61A and the power supply pads 62A. The ground pads 61B and the power supply pads 62B were also formed in parallel with the formation of the pads 61A and 62A.

Subsequently, solder bumps may be formed on the pads 61A and 62A as follows. A commercially available solder resist composition is applied on the substrate and dried. A soda lime glass substrate on which a circular pattern (mask pattern) of solder resist openings are drawn by a chromium layer is placed on the substrate so that the surface having the chromium layer is brought into close contact with the solder resist layer. The solder resist layer is exposed with ultraviolet light, developed, and then heat-treated to form a pattern of the solder resist layer in which areas corresponding to the upper surface of each of the pads 61A and 62A are opened. Subsequently, electroless nickel plating is performed, and electroless gold plating is then performed to form a nickel plating layer and a gold plating layer. A solder paste is printed thereon and reflowed. Thus, solder bumps can be formed. The solder resist layer may be formed or may not be formed.

According to the multilayer printed wiring board 10 described above in detail, the ground lines 11A and 11B and the power supply lines 12A and 12B, which are independently connected to the processor cores 81A and 81B, respectively, are arranged on a motherboard or the like on which the multilayer printed wiring board 10 is mounted so as to maintain the independence. In such a case, even when the electric potentials of the processor core 81A and 81B instantaneously drop, an instantaneous drop in the electric potential can be suppressed by the action of the corresponding layered capacitors 40A and 40B. Even when the voltage of one of the processor core 81A and 81B varies, the variation in the voltage does not affect the other processor core, and thus malfunctioning does not occur.

In addition, the high-dielectric layers 43A and 43B of the first layered capacitor 40A and the second layered capacitor 40B, respectively, are made of a ceramic. Accordingly, the dielectric constants of the high-dielectric layers 43A and 43B can be higher than the dielectric constant of a known dielectric layer made of an organic resin containing an inorganic filler. Furthermore, since the distance between the electrodes is 10 µm or less, which is a distance at which short circuits do not substantially occur, the capacitances of the first layered capacitor 40A and the second layered capacitor 40B can be increased. Therefore, since a satisfactory decoupling effect can be achieved even under a condition that the frequency for switching between the on and off states of the first processor core 81A or the second processor core 81B of the dual core processor 80 is high, i.e., in the range of several gigahertz to several tens of gigahertz (e.g., 3 GHz to 20 GHz), an instantaneous drop in the electric potential does not easily occur. In general, since the built-up portion 30 is prepared under a temperature condition of 200° C. or lower, it is difficult to sinter a high-dielectric material to form a ceramic layer during the formation of the built-up portion 30. However, the high-dielectric layers 43A and 43B of the first layered capacitor 40A and the second capacitor 40B, respectively, are made of a ceramic produced by sintering a high-dielectric material separately from the built-up portion 30. Therefore, the dielectric constants of the high-dielectric layers 43A and 43B can be easily satisfactorily increased.

Furthermore, the number of rod-shaped conductors 66A that passes from the upper surface electrode 42A of the first layered capacitor 40A through the through-hole 45A of the lower surface electrode 41A in a non-contact manner and that is electrically connected to the power supply line 12A is smaller than the number of first power supply pads 62A. Therefore, the number of through-holes 45A of the lower surface electrode 41A can be decreased compared with the case where the number of rod-shaped conductors 66A is the same as the number of first power supply pads 62A. As a result, the area of the lower surface electrode 41A can be increased, and the capacitance of the first layered capacitor 40A can be increased accordingly. In addition, since the amount of conductors used is decreased, the cost can also be reduced. These points also apply to the second layered capacitor 40B.

Furthermore, since the layered capacitors 40A and 40B are provided directly under the corresponding first processor core 81A and second processor core 81B, respectively, the electric power can be supplied to the processor cores 81A and 81B with a short wire length.

Even when a stress due to a difference in thermal expansion between the dual core processor 80 mounted on the mounting portion 60 and the multilayer printed wiring board 10 is generated, the stress relief portion 50 absorbs the stress. Accordingly, problems (for example, the generation of cracks in the ceramic high-dielectric layers 43A and 43B) do not easily occur. The stress relief portion 50 may be provided in only an area directly under the dual core processor 80 mounted on the mounting portion 60. A problem of a stress due to a difference in thermal expansion mainly occurs in the area directly under the dual core processor 80. Therefore, when the stress relief portion 50 is provided on this area, the cost of the material can be reduced.

The present invention is not limited to the above-described embodiment and can be carried out in the form of various modifications within the technical scope of the present invention.

Figure 7:
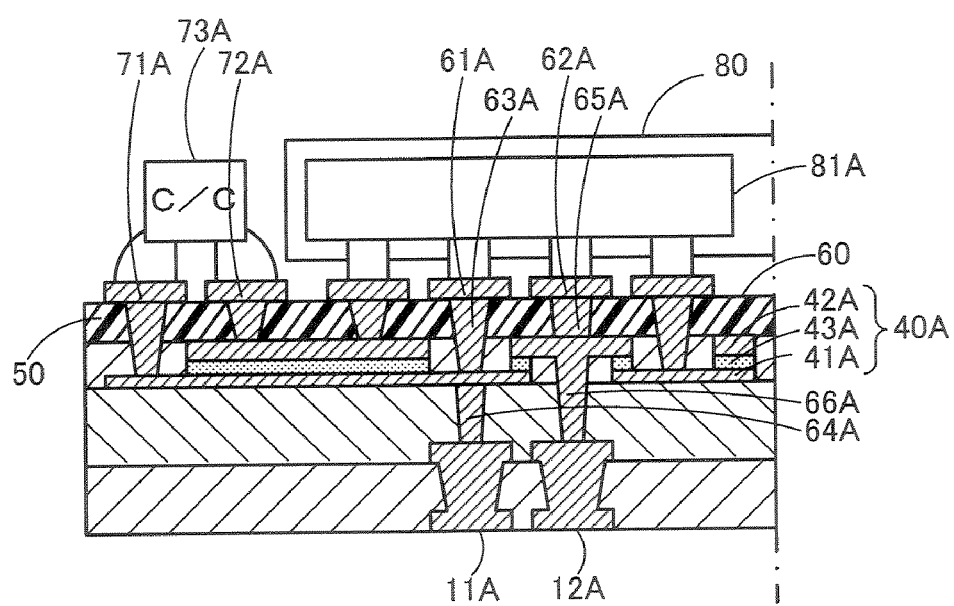
FIG. 7 is a longitudinal cross-sectional view of a modification of the multilayer printed wiring board 10.

For example, as shown in FIG. 7, pads 71A and 72A for mounting a chip capacitor 73A on the mounting portion 60 may be provided. The pad 71A may be connected to a ground line 11A through a lower surface electrode 41A, and the pad 72A may be connected to a power supply line 12A through an upper surface electrode 42A. In this structure, when the capacitance is not sufficient only in the first layered capacitor 40A, the chip capacitor 73A can compensate for the shortage. As the length of the wiring between the chip capacitor 73A and the first processor core 81A increases, the decoupling effect decreases. In this case, however, since the chip capacitor 73A is disposed at the side of the surface having the mounting portion 60 thereon, the distance between the chip capacitor 73A and the first processor core 81A can be small, and thus a decrease in the decoupling effect can be suppressed. Although not shown in the figure, similarly, a chip capacitor may be mounted at the side of the second processor core 81B.

In the above embodiment, the rod-shaped conductor 63A that passes from a ground pad 61A through the through-hole 44A of the upper surface electrode 42A in a non-contact manner and that reaches the lower surface electrode 41A is provided for each of the ground pads 61A. Alternatively, the number of rod-shaped conductors 63A may be smaller than the number of ground pads 61A. Thereby, the number of through-holes 44A is decreased, the area of the upper surface electrode 42A is increased, and the capacitance of the first layered capacitor 40A is increased. In such a case, ground pads 61A that do not have the rod-shaped conductors 63A are electrically connected to the ground pads 61A that have the rod-shaped conductors 63A via connection conductors (provided, for example, in the inside of the stress relief portion 50) arranged in the horizontal direction. Similarly, the capacitance of the second layered capacitor 40B may be increased by the same manner.

[Second Embodiment]

Figure 8:
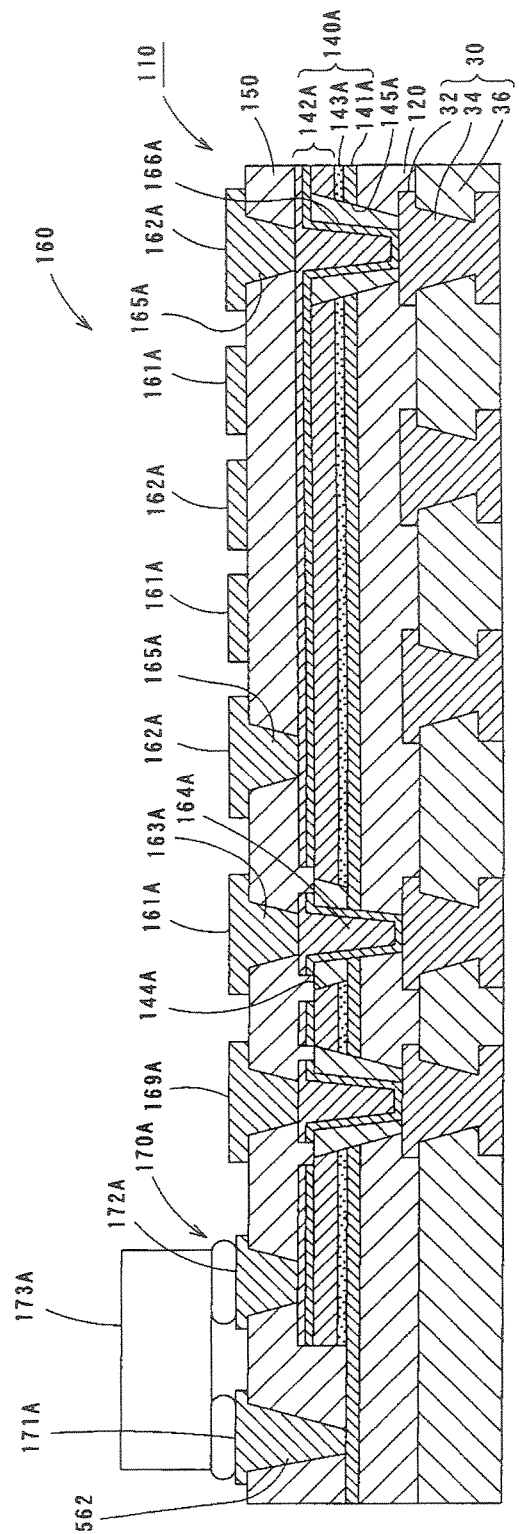
FIG. 8 is a longitudinal cross-sectional view of a multilayer printed wiring board 110 according to a second embodiment.

FIG. 8 is a partial longitudinal cross-sectional view of a multilayer printed wiring board 110 according to a second embodiment. The multilayer printed wiring board 110 includes, as in the first embodiment, a mounting portion 160 on which a dual core processor 80 (see FIG. 1) including a first processor core 81A and a second processor core 81B in a single chip can be mounted, power supply lines that are independently provided for each of the processor cores, ground lines that are independently provided for each of the processor cores, and layered capacitors that are independently provided for each of the processor cores. Here, for convenience of description, a first layered capacitor 140A corresponding to the first processor core 81A will be mainly described. The structure of a second layered capacitor is substantially the same as that of the first layered capacitor 140A.

As shown in FIG. 8, the multilayer printed wiring board 110 of this embodiment includes an interlayer insulating layer 120 stacked on a built-up portion 30 similar to that of the first embodiment; a first layered capacitor 140A that is stacked on the interlayer insulating layer 120 and that includes a lower surface electrode 141A, an upper surface electrode 142A, and a high-dielectric layer 143A disposed between the lower surface electrode 141A and the upper surface electrode 142A; a second layered capacitor (not shown) that is also stacked on the interlayer insulating layer 120 and that has the same structure as the first layered capacitor 140A; a stress relief portion 150 that is stacked on the first layered capacitor 140A and the second layered capacitor and that is made of an elastic material; the mounting portion 160 for mounting the dual core processor 80 (see FIG. 1); and chip capacitor arrangement areas 170A provided around the mounting portion 160.

In the first layered capacitor 140A, the lower surface electrode 141A is a copper electrode and is electrically connected to ground pads 161A of the mounting portion 160 via rod-shaped conductors 163A and 164A. The upper surface electrode 142A is a copper electrode and is electrically connected to power supply pads 162A of the mounting portion 160 via rod-shaped conductors 165A.

The lower surface electrode 141A is a solid pattern provided on the lower surface of the high-dielectric layer 143A and includes passing holes 145A, through which rod-shaped conductors 166A connected to the upper surface electrode 142A penetrate in a non-contact manner. The rod-shaped conductors 166A may be provided so as to correspond to all of the power supply pads 162A. In this embodiment, however, the rod-shaped conductors 166A are provided so as to correspond to some of the power supply pads 162A. The reason for this is as follows. Specifically, among all of the power supply pads 162A, some of the power supply pads 162A are electrically connected to the upper surface electrode 142A through the rod-shaped conductors 165A, and the rest of the power supply pads 162A are electrically connected to the other power supply pads 162A that are electrically connected to the upper surface electrode 142A via the rod-shaped conductors 165A through a wiring (not shown) (for example, a wiring provided in the mounting portion 160). Accordingly, all of the power supply pads 162A are connected to the upper surface electrode 142A. When at least one rod-shaped conductor 166A extending from the upper surface electrode 142A downward is provided, all of the power supply pads 162A can be connected to an external power supply line through the rod-shaped conductor 166A. That is, when the rod-shaped conductors 166A are provided so as to correspond to some of the power supply pads 162A, the number of passing holes 145A provided in the lower surface electrode 141A can be reduced. Consequently, the area of the lower surface electrode 141A can be increased to increase the capacitance of the first layered capacitor 140A. The number of passing holes 145A and the positions at which the passing holes 145A are formed are determined with consideration of the capacitance of the first layered capacitor 140A, the arrangement of the rod-shaped conductors 165A, and the like.

On the other hand, the upper surface electrode 142A is a solid pattern provided on the upper surface of the high-dielectric layer 143A and includes passing holes 144A through which rod-shaped conductors 163A and 164A connected to the ground pads 161A penetrate in a non-contact manner. The rod-shaped conductors 163A and 164A may be provided so as to correspond to all of the ground pads 161A. In this embodiment, however, the rod-shaped conductors 163A and 164A are provided so as to correspond to some of the ground pads 161A. The reason for this is as follows. Specifically, the ground pads 161A are electrically connected to each other through a wiring (not shown) (for example, a wiring provided in the mounting portion 160). Accordingly, when at least one rod-shaped conductor 163A and at least one rod-shaped conductor 164A that extend from the ground pad 161A downward and that are in contact with the lower surface electrode 141A without being in contact with the upper surface electrode 142A are provided, all of the ground pads 161A can be connected to an external ground line through the rod-shaped conductors 163A and 164A. When the rod-shaped conductors 163A and 164A are provided so as to correspond to some of the ground pads 161A, the number of passing holes 144A provided in the upper surface electrode 142A can be reduced. Consequently, the area of the upper surface electrode 142A can be increased to increase the capacitance of the first layered capacitor 140A. The number of passing holes 144A and the positions at which the passing holes 144A are formed are determined with consideration of the capacitance of the first layered capacitor 140A, the arrangement of the rod-shaped conductors 163A and 164A, and the like.

Since the capacitance of the first layered capacitor 140A can be increased as described above, a sufficient decoupling effect can be achieved and the power supply shortage of a transistor of the dual core processor 80 mounted on the mounting portion 160 does not easily occur. The wiring that electrically connects ground pads 161A, for which the rod-shaped conductors 163A and 164A are not provided directly thereunder, to ground pads 161A, for which the rod-shaped conductors 163A and 164A are provided directly thereunder, and the wiring that electrically connects power supply pads 162A, for which the rod-shaped conductor 165A is not provided directly thereunder, to power supply pads 162A, for which the rod-shaped conductor 165A is provided directly thereunder, may be provided on the mounting portion 160. Alternatively, these wirings may be provided on the surface of the core substrate 20 (see FIG. 1) or on the built-up portion 30. Alternatively, a wiring layer may be further provided between the first layered capacitor 140A and the mounting portion 160, and the connection may be established with the wiring layer.

The stress relief portion 150 is made of the same elastic material as that described in the first embodiment. The ground pads 161A, the power supply pads 162A, and pads 169A for a signal, all of which are provided on the mounting portion 160, are arranged in a grid pattern or a checkered pattern. The ground pads 161A and the power supply pads 162A may be arranged near the center in a grid pattern or a checkered pattern, and the pads 169A for a signal may be arranged around the pads 161A and 162A in a grid pattern, a checkered pattern, or at random. The number of terminals of the mounting portion 160 is in the range of 1,000 to 30,000. A plurality of chip capacitor arrangement areas 170A are provided around the mounting portion 160. A ground pad 171A for connecting to a terminal for a ground of a chip capacitor 173A, and a power supply pad 172A for connecting to a terminal for a power supply of the chip capacitor 173A are provided in each of the chip capacitor arrangement areas 170A. The ground pad 171A is connected to a negative electrode of an external power supply via the lower surface electrode 141A of the first layered capacitor 140A. The power supply pad 172A is connected to a positive electrode of the external power supply via the upper surface electrode 142A.

Figure 9:
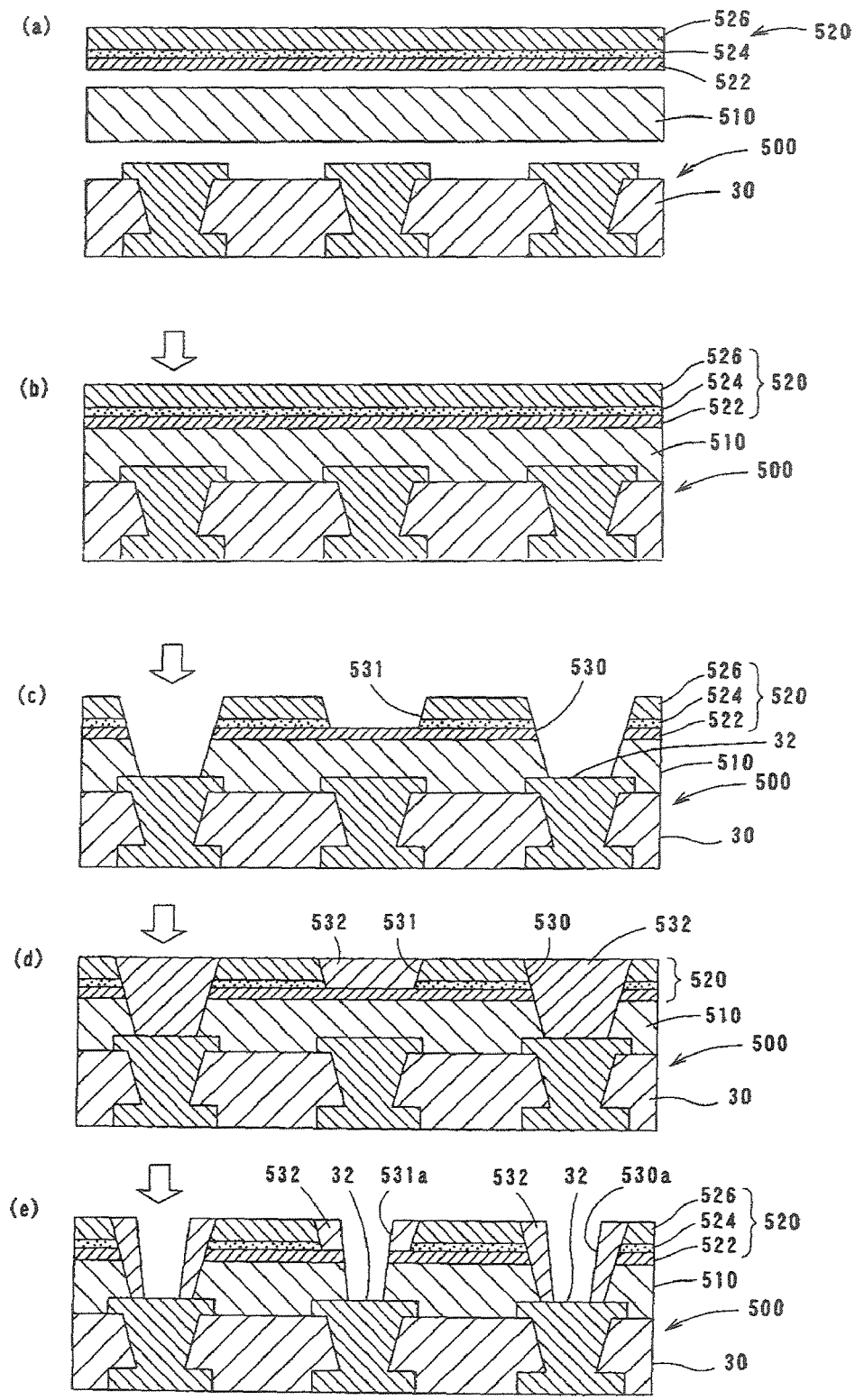
FIG. 9 includes views illustrating a process of producing the multilayer printed wiring board 110.
Figure 10:
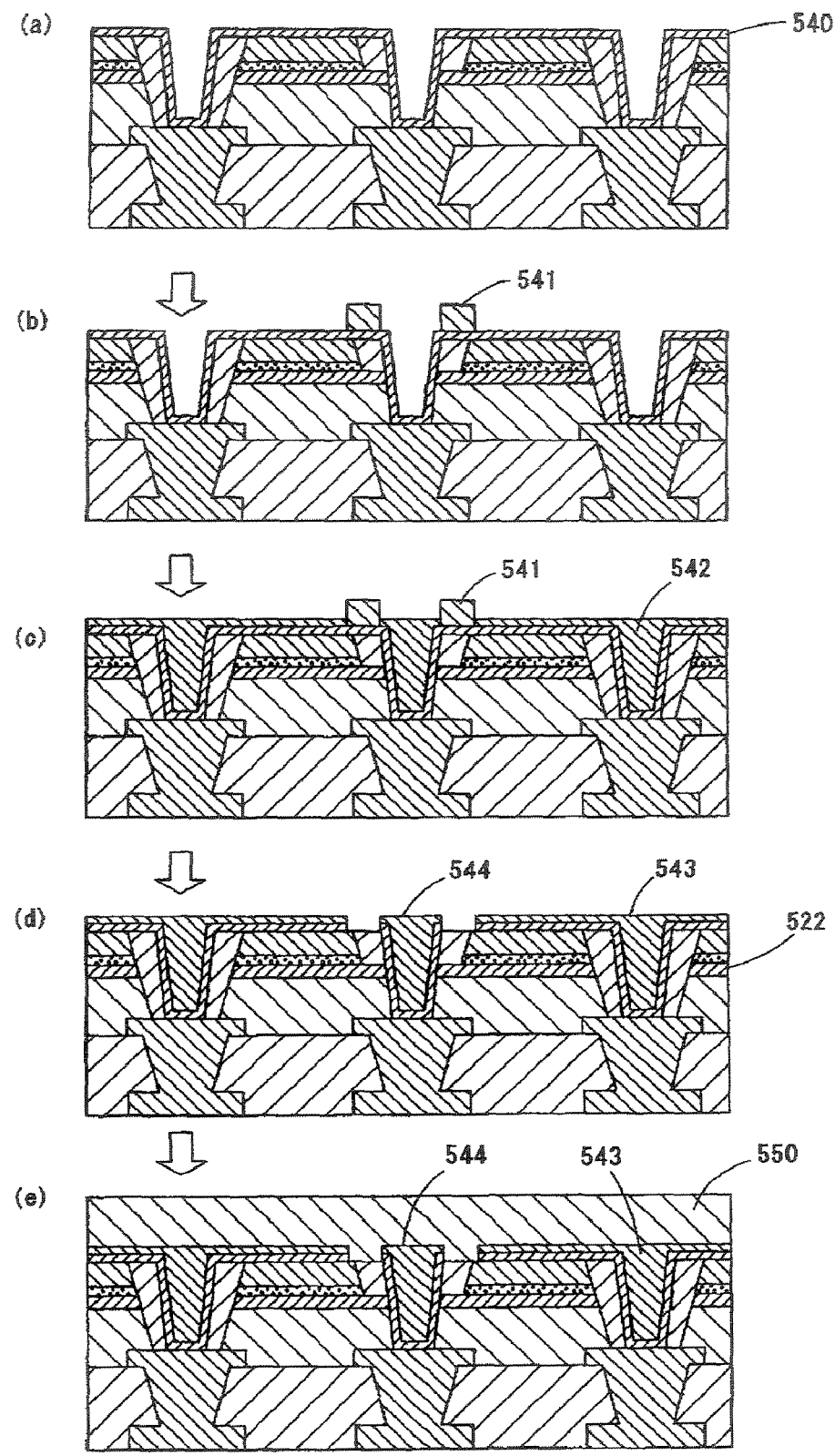
FIG. 10 includes views illustrating the process of producing the multilayer printed wiring board 110.
Figure 11:
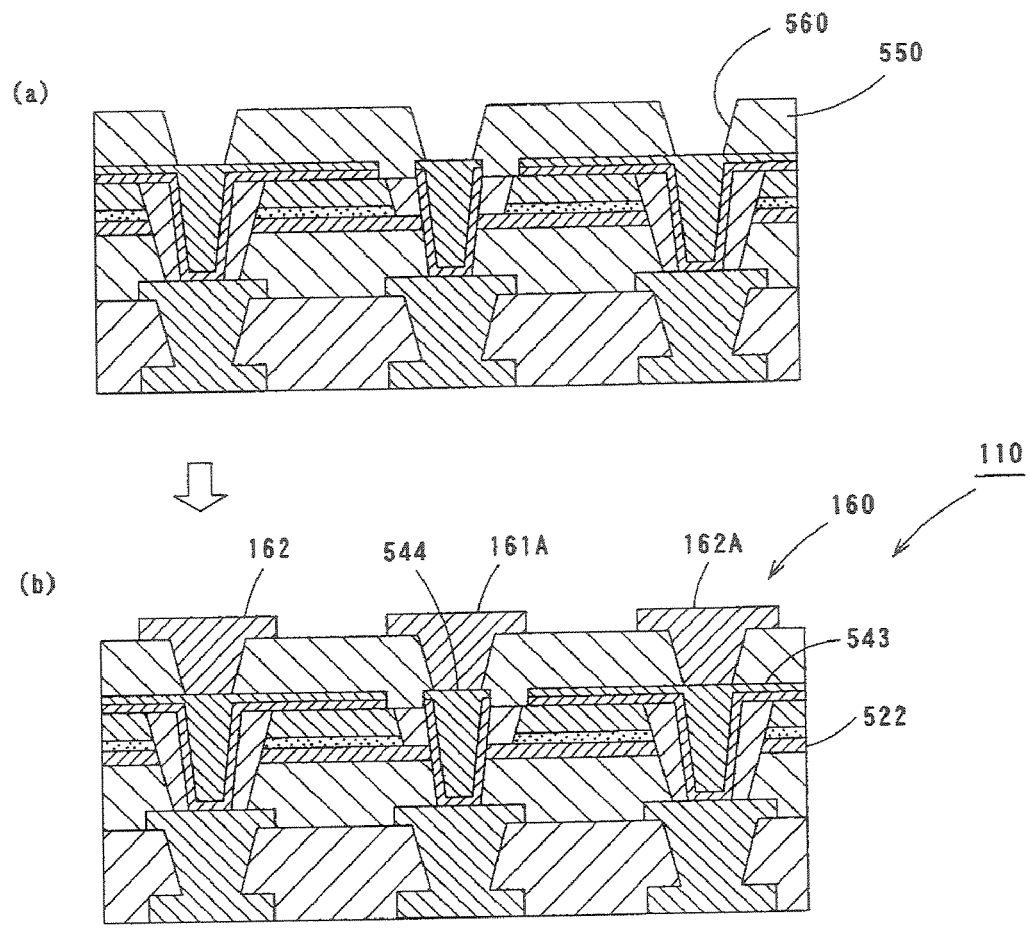
FIG. 11 includes views illustrating the process of producing the multilayer printed wiring board 110.

Next, a process of producing the multilayer printed wiring board 110 of this embodiment will be described with reference to FIGS. 9 to 11. For convenience of description, a cross section that is different from that shown in FIG. 8 is shown in FIGS. 9 to 11.

Figure 12:
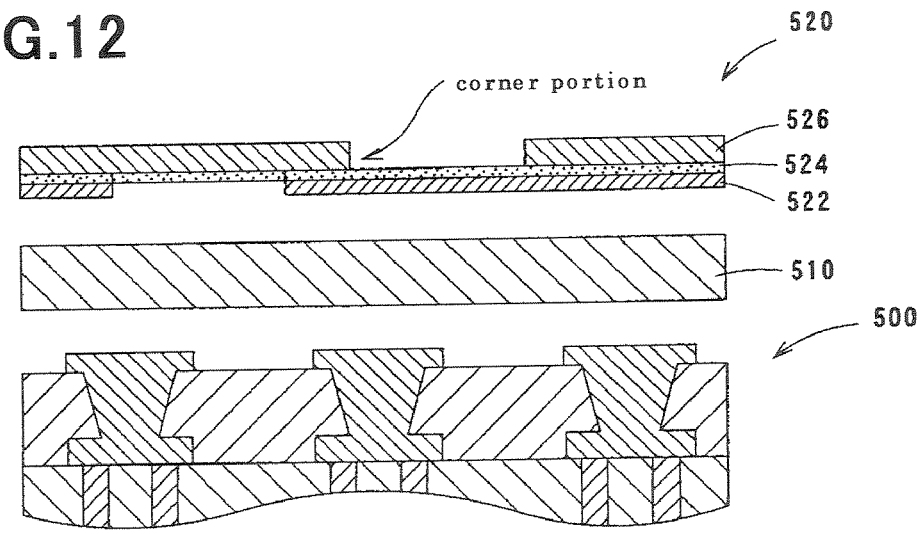
FIG. 12 is a view illustrating a high-dielectric sheet 520 having corner portions.

First, as shown in FIG. 9(a), a substrate 500 in which a built-up portion 30 was provided on a surface of a core substrate was prepared. An interlayer insulating layer 510 (which was formed into the interlayer insulating layer 120 shown in FIG. 8, a thermosetting insulating film, manufactured by Ajinomoto Co., Inc., ABF-45SH) was bonded onto the built-up portion 30 using a vacuum laminator under laminating conditions at a temperature in the range of 50° C. to 150° C. and at a pressure in the range of 0.5 to 1.5 MPa. Subsequently, a high-dielectric sheet 520 prepared in advance and having a structure in which a high-dielectric layer 524 was sandwiched between copper foils 522 and 526 was bonded onto the interlayer insulating layer 510 using a vacuum laminator under laminating conditions at a temperature in the range of 50° C. to 150° C. and a pressure in the range of 0.5 to 1.5 MPa and was then dried at 150° C. for one hour (see FIG. 9(b)). The copper foils 522 and 526 of the high-dielectric sheet 520 used in this lamination are preferably solid layers on which no circuits are formed. When a part of the copper foils 522 and 526 are removed by etching or the like, for example, the following problems occur: (i) The high-dielectric sheet may be bent or broken because the residual ratios of the metal become different between the upper surface and the lower surface of the high-dielectric sheet, or the high-dielectric sheet may be bent or broken from a portion where the copper foil is removed. (ii) When a part of a copper foil is removed, corner portions (see FIG. 12) are formed, and the lamination pressure is concentrated on the corner portions. (iii) The laminator is directly in contact with the high-dielectric layer. As a result, cracks are easily generated in the high-dielectric layer, and when the cracked portions are filled with a plating film in a subsequent plating step, the copper foils are short-circuited. Furthermore, when a part of the electrode is removed before lamination, a problem of a decrease in the capacitance of the high-dielectric sheet occurs. When such a high-dielectric sheet is laminated, it is necessary to align the positions of the high-dielectric sheet and the built-up portion and to bond them to each other. Furthermore, since the high-dielectric sheet has a small thickness and does not have rigidity, the positional accuracy during the removal of a part of a copper foil is degraded. In addition, since a part of a copper foil must be removed with consideration of the alignment accuracy, a larger part of the copper foil must be removed. Furthermore, the alignment accuracy is not satisfactory because of the small thickness of the high-dielectric sheet. Accordingly, the copper foils 522 and 526 of the high-dielectric sheet 520 used in the lamination are preferably solid layers on which no circuits are formed.

Next, a process of preparing a high-dielectric sheet 520 will now be described.

(1) Diethoxybarium and titanium bitetraisopropoxide were weighed in a dry nitrogen atmosphere so as to prepare a solution with a concentration of 1.0 mol/liter, and then dissolved in a mixed solvent (volume ratio 3:2) of dehydrated methanol and 2-methoxyethanol. The solution was stirred at room temperature in a nitrogen atmosphere for three days to prepare an alkoxide precursor composition solution containing barium and titanium. The precursor composition solution was then stirred while the temperature was maintained at 0° C. Decarbonated water was sprayed into the solution at a rate of 0.5 microliter/min in a nitrogen gas stream to perform hydrolysis.

(2) A sol-gel solution thus prepared was filtered using a 0.2 μm-filter to remove precipitates and the like.

(3) The filtrate prepared in (2) above was applied onto a copper foil 522 (which was formed into the lower surface electrode 141A in subsequent steps) having a thickness of 12 μm by spin coating at 1,500 rpm for one minute. The substrate on which the solution was spin-coated was placed on a hot plate maintained at 150° C. for three minutes to dry the solution. The substrate was then placed in an electric furnace maintained at 850° C., and sintering was performed for 15 minutes. In this process, the viscosity of the sol-gel solution was adjusted so that the film thickness obtained by performing a series of spin-coating, drying, and sintering once was 0.03 μm. Instead of copper, other metals such as nickel, platinum, gold, or silver may be used for the lower surface electrode 141A.

(4) The spin-coating, drying, and sintering were repeated 40 times to prepare a high-dielectric layer 524 having a thickness of 1.2 μm.

(5) Subsequently, a copper layer was formed on the high-dielectric layer 524 using a vacuum deposition system such as a sputtering system. Furthermore, a copper layer having a thickness of about 10 μm was formed on the copper layer by electrolytic plating or the like, thereby forming a copper foil 526 (which was formed into a part of the upper surface electrode 142A in subsequent steps). Thus, the high-dielectric sheet 520 was obtained. The dielectric characteristics of the high-dielectric sheet 520 were measured using an IMPEDANCE/GAIN PHASE ANALYZER (manufactured by Hewlett-Packard Development Company L.P., name of product: 4194A) under the conditions at a frequency of 1 kHz, at a temperature of 25° C., and an OSC level of 1 V. The relative dielectric constant was 1,850. Instead of the deposited copper layer, another metal layer such as a platinum layer or a gold layer may be formed by vacuum deposition. Instead of the electrolytically plated copper layer, another metal layer such as a nickel layer or a tin layer may be formed by electrolytic plating. In this embodiment, the high-dielectric layer is made of barium titanate. Alternatively, by using another sol-gel solution, the high-dielectric layer made of strontium titanate (Sr-TiO$_3$), a tantalum oxide (TaO$_3$ or Ta$_2$O$_5$), lead zirconate titanate (PZT), lead lanthanum zirconate titanate (PLZT), lead niobium zirconate titanate (PNZT), lead calcium zirconate titanate (PCZT), or lead strontium zirconate titanate (PSZT) can also be produced.

Another method of producing a high-dielectric sheet 520 is the following method. Specifically, a barium titanate powder (manufactured by Fuji Titanium Industry Co., Ltd., HPBT series) is dispersed in a binder solution prepared by mixing 5 parts by weight of polyvinyl alcohol, 50 parts by weight of pure water, and 1 part by weight of dioctyl phthalate or dibutyl phthalate used as a solvent plasticizer relative to the total weight of the barium titanate powder. The dispersion liquid is printed on a copper foil 522 (which is formed into the lower surface electrode 141A in subsequent steps) having a thickness of 12 μm so as to form a thin film having a thickness in the range of about 5 to 7 μm using a printing device such as a roll coater, a doctor blade, or an α-coater. The thin film is then dried at 60° C. for one hour, at 80° C. for three hours, at 100° C. for one hour, at 120° C. for one hour, and at 150° C. for three hours to form an unsintered layer. Instead of the paste containing BaTiO$_3$, a paste containing at least one metal oxide selected from the group consisting of SrTiO$_3$, TaO$_3$, Ta$_2$O$_5$, PZT, PLZT, PNZT, PCZT, and PSZT may be printed so as to form a thin film having a thickness in the range of 0.1 to 10 μm using a printing device such as a roll coater or a doctor blade and then dried to form an unsintered layer. After the printing, the unsintered layer is sintered in a temperature range of 600° C. to 950° C. to form a high-dielectric layer 524. Subsequently, a copper layer is formed on the high-dielectric layer 524 using a vacuum deposition system such as a sputtering system. Furthermore, an additional copper layer having a thickness of about 10 μm is formed on the copper layer by electrolytic plating or the like, thereby forming a copper foil 526 (which is formed into a part of the upper surface electrode 142A in subsequent steps). Instead of the deposited copper layer, another metal layer such as a platinum layer or a gold layer may be formed by vacuum deposition. Instead of the electrolytically plated copper layer, another metal layer such as a nickel layer or a tin layer may be formed by electrolytic plating. Alternatively, the barium titanate layer may be formed by sputtering using a barium titanate target.

Next, through-holes 530 and 531 were formed at predetermined positions of the above substrate having the high-dielectric sheet 520 thereon using a carbon dioxide gas laser, a UV laser, a YAG laser, an excimer laser, or the like (see FIG. 9(c)). The through-holes 530 having a large depth penetrated through the high-dielectric sheet 520 and the interlayer insulating layer 510 and reached the surface of a wiring pattern 32 of the built-up portion 30. The through-holes 531 having a small depth penetrated through the copper foil 526 and the high-dielectric layer 524 and reached the surface of the copper foil 522. In this embodiment, first, the deep through-holes 530 were formed, and the shallow through-holes 531 were then formed. The depths of the through-holes were controlled by changing the number of laser shots. More specifically, the through-holes 531 were formed using a UV laser device manufactured by Hitachi Via Mechanics, Ltd. under the conditions of an output in the range of 3 to 10 W, at a frequency in the range of 30 to 60 kHz, and with the number of shots of 4. The through-holes 530 were formed under the same conditions as those used for the through-holes 531 except that the number of shots was changed to 31. Subsequently, the through-holes 530 and 531 were filled with a resin 532 for filling through-holes described below, and the resin 532 was then dried at 80° C. for one hour, at 120° C. for one hour, and at 150° C. for 30 minutes (see FIG. 9(d)). The through-holes 530 and 531 were not formed so as to correspond to all of the power supply pads 162A and ground pads 161A (30,000 pads) shown in FIG. 8.

The resin for filling through-holes was prepared as follows. First, 100 parts by weight of a bisphenol F-type epoxy monomer (manufactured by Yuka-Shell Epoxy Co., Ltd., molecular weight: 310, trade name: E-807) was mixed with 6 parts by weight of an imidazole curing agent (manufactured by Shikoku Chemicals Corporation, trade name: 2E4MZ-CN). Furthermore, 170 parts by weight of spherical $SiO_2$ particles having an average particle diameter of 1.6 μm were mixed to the mixture. The resulting mixture was kneaded with a three-roll mill so that the viscosity of the mixture was in the range of 45,000 to 49,000 cps at 23° C.±1° C. Thus, the resin for filling through-holes was obtained.

Subsequently, through-holes 530a and 531a were formed in the resin 532 for filling through-holes filled in the previous step. The substrate was immersed in a permanganic acid solution to roughen the surfaces of the through-holes 530a and 531a. Subsequently, drying and curing were performed at 170° C. for three hours to completely cure the resin 532 (see FIG. 9(e)). The through-holes 530a penetrated through the resin 532 for filling through-holes and reached the surface of the wiring pattern 32 of the built-up portion 30. On the other hand, the through-holes 531a penetrated through the resin 532 for filling through-holes, the copper foil 522, and the interlayer insulating layer 510 and reached the surface of the wiring pattern 32 of the built-up portion 30. Each of the through-holes 530a was formed using a $CO_2$ laser via a mask diameter of 1.4 mm, at an energy density of 2.0 mj, and a number of shots of 2. Each of the through-holes 531a was formed under the same conditions as those used for the through-holes 530a except that a UV laser was used and the number of shots was changed to 52 (output: 3 to 10 W, frequency: 30 to 60 kHz).

Subsequently, a catalyst for electroless copper plating was applied on the surface of the substrate. The substrate was immersed in the following electroless copper plating solution. Accordingly, an electroless copper plating film 540 having a thickness in the range of 0.6 to 3.0 μm was formed on the surface of the substrate (see FIG. 10(a)). An aqueous electroless copper plating solution containing 0.03 mol/L copper sulfate, 0.200 mol/L EDTA, 0.1 g/L HCHO, 0.1 mol/L NaOH, 100 mg/L α,α'-bipyridyl, and 0.1 g/L polyethylene glycol (PEG) was used.

Next, a commercially available dry film was applied on the electroless copper plating film 540, exposed, and then developed to form a plating resist 541 (see FIG. 10(b)). Subsequently, an electrolytic copper plating film 542 having a thickness of 25 μm was then formed on portions where the plating resist was not formed (see FIG. 10(c)). An electrolytic copper plating solution containing 200 g/L sulfuric acid, 80 g/L copper sulfate, and 19.5 mL/L additive (manufactured by Atotech Japan, Capalacid GL) was used. The electrolytic copper plating was performed for 115 minutes under the conditions at a current density of 1 A/dm$^2$ and at a temperature of 23° C.±2° C. Subsequently, the plating resist 541 was removed, and a part of the electroless copper plating film 540 disposed under areas where the plating resist 541 remained, i.e., a part of the electroless copper plating film 540 disposed between the electrolytic copper plating films 542 was removed by etching (quick etching) with an etchant containing sulfuric acid and hydrogen peroxide. Accordingly, an upper electrode 543 and a land 544 that is electrically connected to the copper foil 522 were formed (see FIG. 10(d)).

Subsequently, a stress relief sheet 550 described below (which was formed into the stress relief portion 150 shown in FIG. 8) was applied on the upper electrode 543 and the land 544 under the laminating conditions at a temperature in the range of 50° C. to 150° C. and at a pressure in the range of 0.5 to 1.5 MPa. The stress relief sheet 550 was then dried at 150° C. for one hour (see FIG. 10(e)).

The stress relief sheet 550 was prepared as follows. First, 100 parts by weight of a naphthalene-type epoxy resin (manufactured by Nippon Kayaku Co., Ltd., trade name: NC-7000L), 20 parts by weight of a phenol-xylylene glycol condensation resin (manufactured by Mitsui Chemicals, Inc., trade name: XLC-LL), 90 parts by weight of a carboxylic acid-modified NBR having a Tg of −50° C. (manufactured by JSR Corporation, trade name: XER-91) used as cross-linked rubber particles, and 4 parts by weight of 1-cyanoethyl-2-ethyl-4-methylimidazole were dissolved in 300 parts by weight of ethyl lactate. The resulting resin composition was applied onto a film made of polymethylpentene (TPX) (manufactured by Mitsui Petrochemical Industries, Ltd., trade name: Opulent X-88) with a thickness in the range of 42 to 45 μm using a roll coater (manufactured by Cermatronics Boeki Co., Ltd.). The film was then dried at 80° C. for two hours, at 120° C. for one hour, and at 150° C. for 30 minutes to form a stress relief sheet having a thickens of 40 μm. This stress relief sheet had a Young's modulus of 500 MPa at 30° C.

Via holes 560 were then formed at predetermined positions of the stress relief sheet 550 using a $CO_2$ laser via a mask diameter of 1.4 mm, at an energy density of 2.0 mj, and a number of shots of one (see FIG. 11(a)). Subsequently, a roughening treatment was performed, and drying and curing were performed at 150° C. for three hours to completely cure the stress relief sheet 550. Subsequently, a catalyst application, chemical copper plating, the formation of a plating resist, copper electroplating, the removal of the plating resist, and quick etching were performed to fill each of the via holes 560 with a metal. In addition, a pad (a ground pad 161A or a power supply pad 162A) was formed as a top surface layer on the upper surface of each of the via holes 560. Thus, a multilayer printed wiring board 110 including a mounting portion 160 was obtained (FIG. 11(b)). The ground pads 161A connected to the lands 544 and the copper foil 542 were connected to a ground line. The power supply pads 162A connected to the upper electrode 543 were connected to a power supply line.

Subsequently, solder bumps may be formed on each terminal of the mounting portion 60 (see the method of forming solder bumps described in the first embodiment). When a chip capacitor 173A was mounted as shown in FIG. 8, after the step shown in FIG. 9(b), an etching process (i.e., a tenting process) was performed such that one of the terminals of the chip capacitor 173A was electrically connected to the lower surface electrode 141A via a conductor 562. An etchant containing cupric chloride was used in the etching process. The process was performed within a short time such that the copper foil 526 and the high-dielectric layer 524 were completely etched, and the copper foil 522 was then slightly etched. Ultimately, a metal layer connected to the copper foil 522 was provided on the stress relief sheet 550, and the pad 171A was provided on the metal layer. The pad 172A for connecting to another terminal of the chip capacitor 173A was formed on the upper surface of a metal filled in one of the via holes 560 formed on the stress relief sheet 550.

According to the multilayer printed wiring board 110 of the second embodiment described above in detail, the same advantages as those of the first embodiment can be achieved. In this embodiment, a facing area S between the lower surface electrode 141A and the upper surface electrode 142A was determined so that the capacitance C of the first layered capacitor 140A was 0.5 µF directly under a die. The number of passing holes 145A of the lower surface electrode 141A, the positions of the passing holes 145A, the number of passing holes 144A of the upper surface electrode 142A, and the positions of the passing holes 144A were determined on the basis of the facing area S. Herein, the facing area S was calculated from a formula of $C=\in_0\cdot\in_r\cdot d/S$. More specifically, the relative dielectric constant $\in_r$ of the high-dielectric layer 143A was 1,850, and the thickness d thereof was 1.2 µm. These values were substituted for the above formula, and 0.5 µF was substituted for the capacitance C. Thus, the facing area S was calculated. In the formula, $\in_0$ represents the dielectric constant (constant) in vacuum.

[Third Embodiment]

Figure 13:
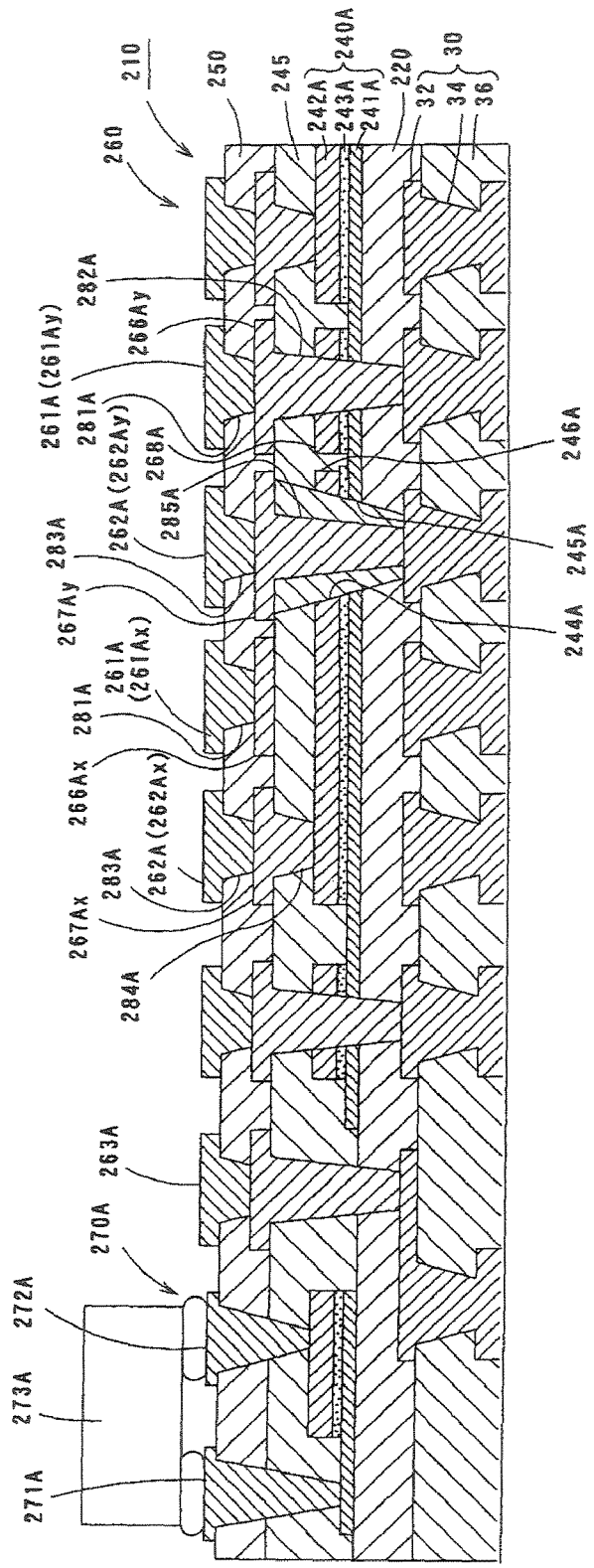
FIG. 13 is a longitudinal cross-sectional view of a multilayer printed wiring board 210 according to a third embodiment.

FIG. 13 is a partial longitudinal cross-sectional view of a multilayer printed wiring board 210 according to a third embodiment. The multilayer printed wiring board 210 includes, as in the first embodiment, a mounting portion 260 on which a dual core processor 80 (see FIG. 1) including a first processor core 81A and a second processor core 81B in single chip can be mounted, power supply lines that are independently provided for each of the processor cores, ground lines that are independently provided for each of the processor cores, and layered capacitors that are independently provided for each of the processor cores. Here, for convenience of description, a first layered capacitor 240A corresponding to the first processor core 81A will be mainly described. The structure of a second layered capacitor is substantially the same as that of the first layered capacitor 240A.

As shown in FIG. 13, the multilayer printed wiring board 210 of this embodiment includes an interlayer insulating layer 220 stacked on a built-up portion 30 similar to that of the first embodiment; a first layered capacitor 240A that is stacked on the interlayer insulating layer 220 and that includes a lower surface electrode 241A, an upper surface electrode 242A, and a high-dielectric layer 243A disposed between the lower surface electrode 241A and the upper surface electrode 242A; a second layered capacitor (not shown) that is also stacked on the interlayer insulating layer 220 and that has the same structure as the first layered capacitor 240A; an interlayer insulating layer 245 stacked on the first layered capacitor 240A and the second layered capacitor; a stress relief portion 250 that is stacked on the interlayer insulating layer 245 and that is made of an elastic material; the mounting portion 260 for mounting the dual core processor 80 (see FIG. 1); and chip capacitor arrangement areas 270A provided around the mounting portion 260.

In the first layered capacitor 240A the lower surface electrode 241A is a copper electrode provided on the lower surface of the high-dielectric layer 243A and having a solid pattern, and is electrically connected to ground pads 261A of the mounting portion 260. For convenience of description, the ground pads 261A are classified into two types of pads, i.e., ground pads 261Ax and ground pads 261Ay. Among these pads, each of the ground pads 261Ax is electrically connected to a land 266Ax through a rod-shaped conductor 281A. No rod-shaped conductor is provided directly under the land 266Ax. Each of the ground pads 261Ay is connected to a land 266Ay through a rod-shaped conductor 281A. The land 266Ay is electrically connected to the lower surface electrode 241A and a ground line of the wiring pattern 32 of the built-up portion 30 through a rod-shaped conductor 282A. A land 268A connected to the rod-shaped conductor 282A is electrically independent from the upper surface electrode 242A. The land 266Ax connected to the ground pad 261Ax is electrically connected to the land 266Ay connected to the ground pad 261Ay via a wiring 246A (see FIG. 14). As a result, all of the ground pads 261A have the same electric potential. Thus, the lower surface electrode 241A is connected to each of the ground pads 261A and connected to the ground line of the wiring pattern 32 of the built-up portion 30. Accordingly, the lower surface electrode 241A is connected to an external ground line via this ground line. The lower surface electrode 241A includes passing holes 245A through which rod-shaped conductors 285A described below penetrate in a non-contact manner. Since the rod-shaped conductors 285A are provided so as to correspond to some of the power supply pads 262Ay as described below, the number of passing holes 245A can be decreased. As a result, the area of the lower surface electrode 241A is increased, and thus the capacitance of the first layered capacitor 240A can be increased. The number of passing holes 245A and the positions at which the passing holes 245A are formed are determined with consideration of the capacitance of the first layered capacitor 240A and the like.

On the other hand, the upper surface electrode 242A is a copper electrode provided on the upper surface of the high-dielectric layer 243A and having a solid pattern. The upper surface electrode 242A is electrically connected to the power supply pads 262A of the mounting portion 260. For convenience of description, the power supply pads 262A are classified into two types of pads, i.e., power supply pads 262Ax and power supply pads 262Ay. Among these pads, each of the power supply pads 262Ax is connected to a land 267Ax through a rod-shaped conductor 283A, and the land 267Ax is electrically connected to the upper surface electrode 242A through a rod-shaped conductor 284A. Each of the power supply pads 262Ay is connected to a land 267Ay through a rod-shaped conductor 283A, and the land 267Ay is electrically connected to a power supply line of the wiring pattern 32 of the built-up portion 30 through a rod-shaped conductor 285A without being in contact with the lower surface electrode 241A and the upper surface electrode 242A. The land 267Ax connected to the power supply pad 262Ax is electrically connected to the land 267Ay connected to the power supply pad 262Ay via a wiring 247A (see FIG. 14). As a result, all of the power supply pads 262A have the same electric potential. Thus, the upper surface electrode 242A is connected to each of the power supply pads 262A and connected to the power supply line of the wiring pattern 32 of the built-up portion 30. Accordingly, the upper surface electrode 242A is connected to an external power supply line via this power supply line. Consequently, an electric power is supplied to the upper surface electrode 242A from the power supply line of the wiring pattern 32 of the built-up portion 30 through the via hole 285A, the wiring 247A, and the rod-shaped conductor 283A. The upper surface electrode 242A includes passing holes 244Aa through which rod-shaped conductors 285A penetrate in a non-contact manner, and passing holes 246A for ensuring insulation with the lands 268A. Since the rod-shaped conductors 285A are provided so as to correspond to some of the power supply pads 262Ay among the power supply pads 262A, and the passing holes 246A are provided so as to correspond to some of the ground pads 261Ay among the ground pads 261A. Accordingly, the number of passing holes 244A and the number of passing holes 246A can be decreased. As a result, the area of the upper surface electrode 242A is increased, and thus the capacitance of the first layered capacitor 240A can be increased. The number of passing holes 244A and 246A and the positions at which the passing holes 244A and 246A are formed are determined with consideration of the capacitance of the first layered capacitor 240A and the like.

Since the capacitance of the first layered capacitor 240A can be increased as described above, a sufficient decoupling effect can be achieved and the power supply shortage of a transistor of the dual core processor 80 (see FIG. 1) mounted on the mounting portion 260 does not easily occur. The ground pad 261Ax is connected to the ground pad 261Ay via the wiring 246A on the interlayer insulating layer 245, and the power supply pad 262Ax is connected to the power supply pad 262Ay via the wiring 247A on the interlayer insulating layer 245. Alternatively, such a wiring may be provided on any layer disposed above the upper surface electrode (e.g., on the mounting portion), on the surface of the core substrate, or on the built-up portion 30. Furthermore, when the ground pads 261Ax are connected to the ground pads 261Ay via a wiring of any of the layers, and the power supply pads 262Ax are connected to the power supply pads 262Ay with a wiring of any of the layers, the rod-shaped conductors 281A need not be provided directly under all of the ground pads 261A and the rod-shaped conductor 283A need not be provided directly under all of the power supply pads 262A. Accordingly, the number of lands on a layer disposed directly under the mounting portion can also be decreased. Consequently, since the number of via holes and the number of lands to be provided are decreased, a high-density structure can be realized.

The stress relief portion 250 is made of the same elastic material as that of the stress relief portion 50 of the first embodiment. The ground pads 261A, the power supply pads 262A, and pads 263A for a signal, all of which are provided on the mounting portion 260, are arranged in a grid pattern or a checkered pattern. The ground pads 261A and the power supply pads 262A may be arranged near the center in a grid pattern or a checkered pattern, and the pads 263A for a signal may be arranged around the pads 261A and 262A in a grid pattern, a checkered pattern, or at random. The number of terminals of the mounting portion 260 is in the range of 1,000 to 30,000. A plurality of chip capacitor arrangement areas 270A are provided around the mounting portion 260. A ground pad 271A for connecting to a terminal for a ground of a chip capacitor 273A, and a power supply pad 272A for connecting to a terminal for a power supply of the chip capacitor 273A are provided in each of the chip capacitor arrangement areas 270A. The ground pad 271A is connected to a negative electrode of an external power supply via the lower surface electrode 241A of the first layered capacitor 240A. The power supply pad 272A is connected to a positive electrode of the external power supply via the upper surface electrode 242A.

Figure 14:
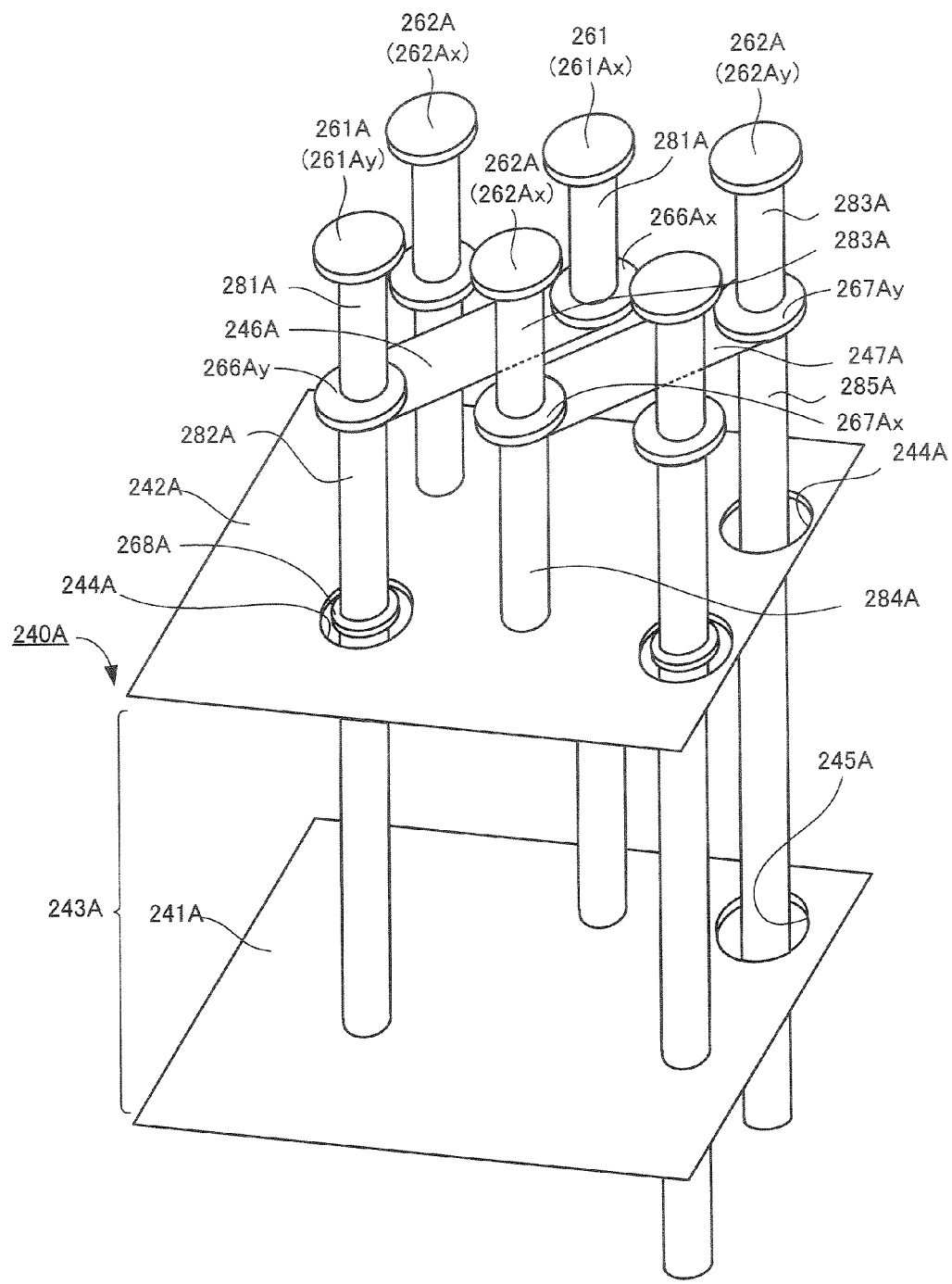
FIG. 14 is a schematic view illustrating a layered capacitor 240A.
Figure 15:
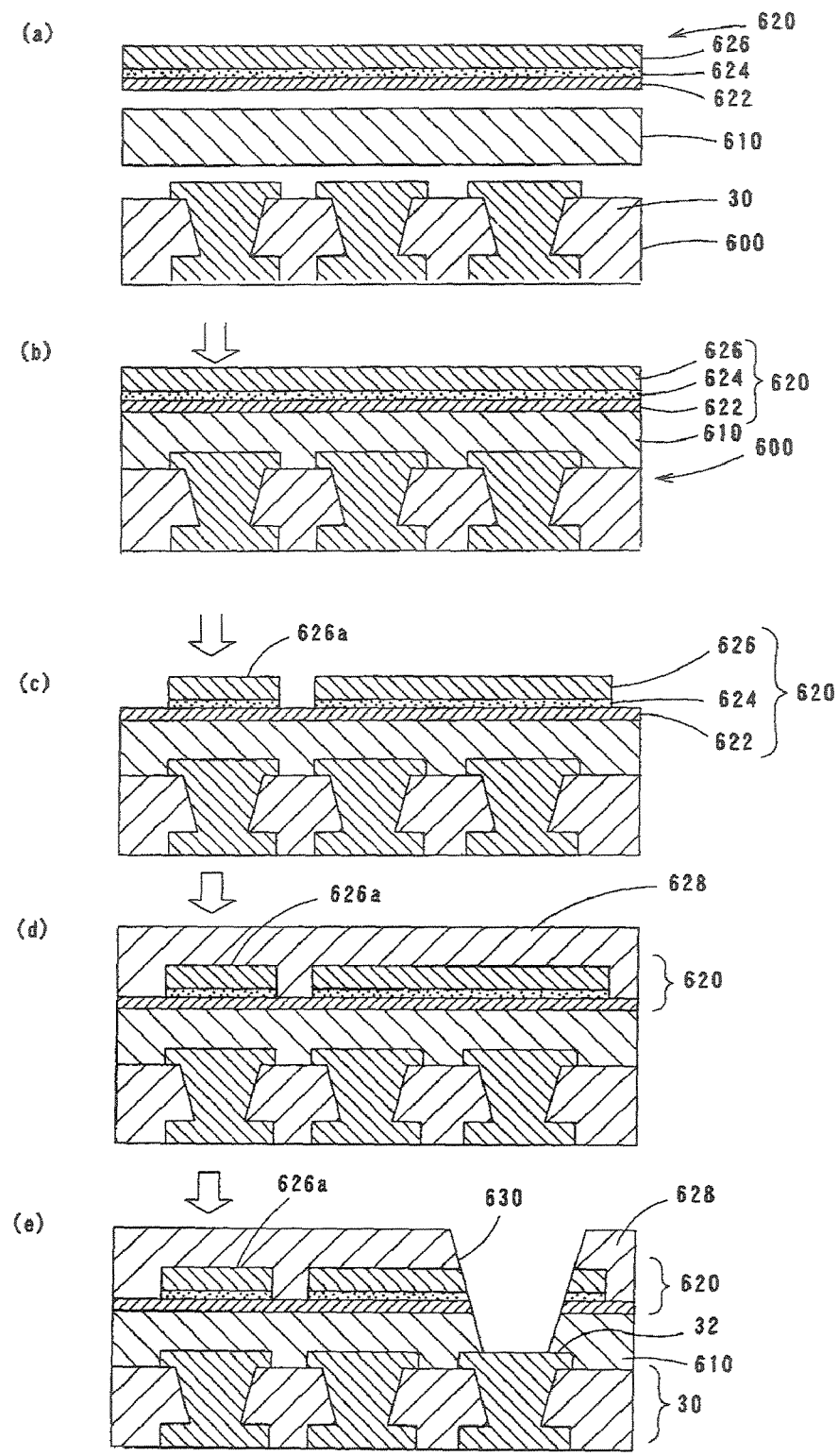
FIG. 15 includes views illustrating a process of producing the multilayer printed wiring board 210.
Figure 16:
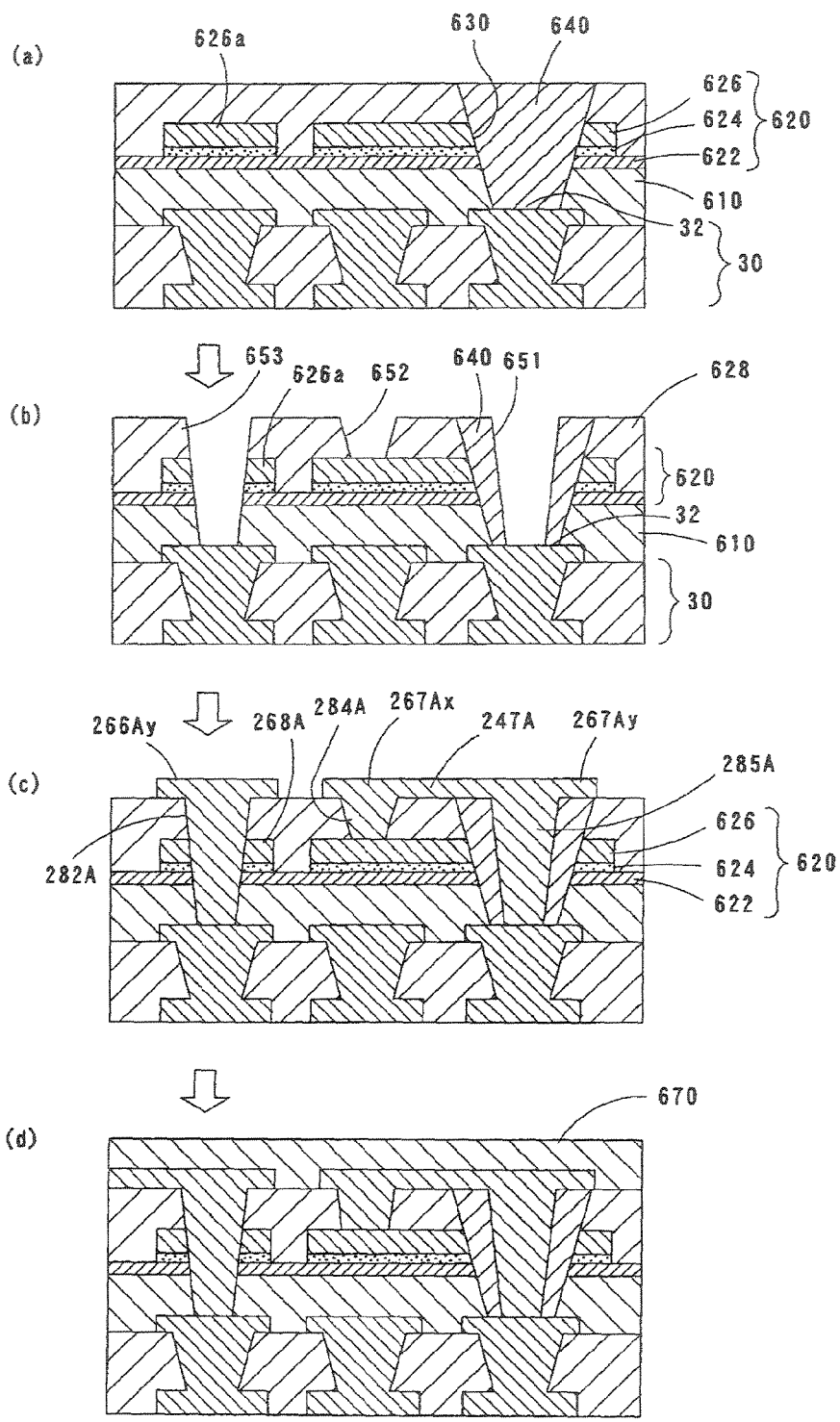
FIG. 16 includes views illustrating the process of producing the multilayer printed wiring board 210.
Figure 17:
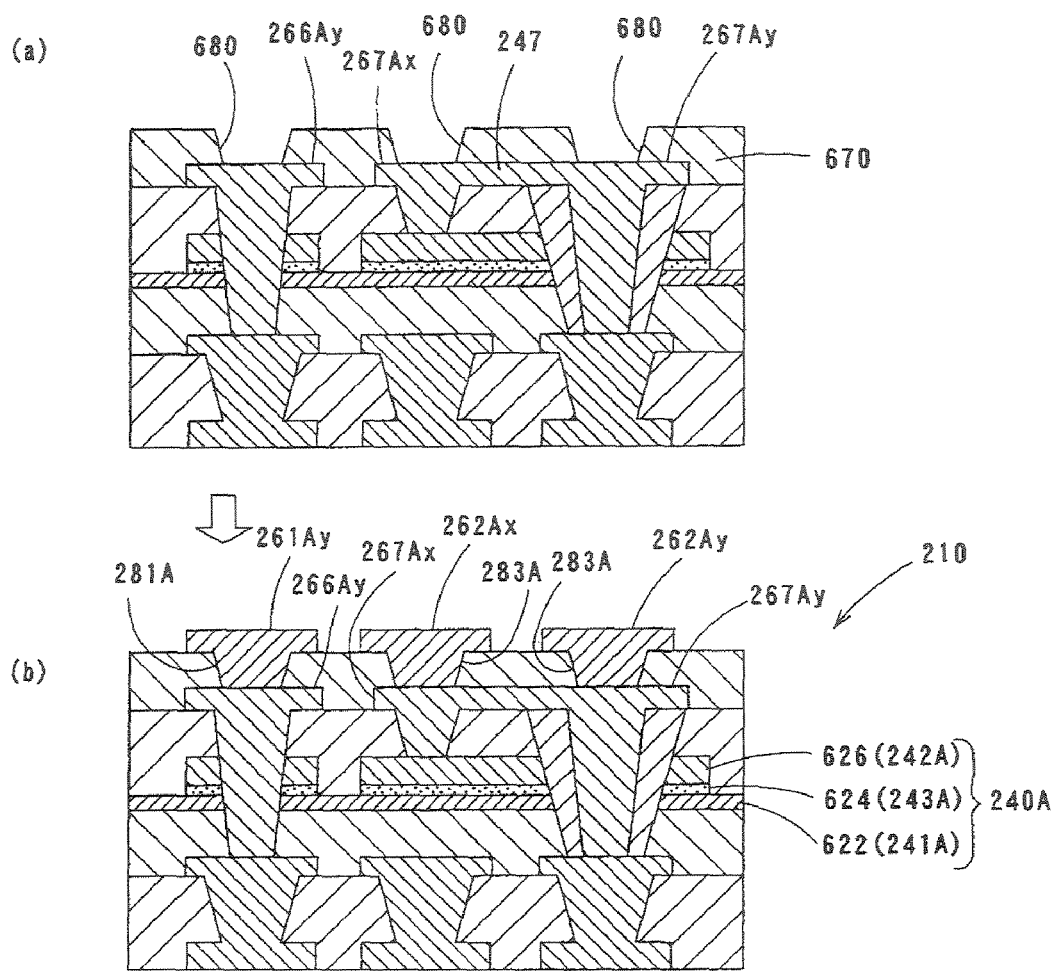
FIG. 17 includes views illustrating the process of producing the multilayer printed wiring board 210.

A process of producing the multilayer printed wiring board 210 of this embodiment will now be described with reference to FIGS. 15 to 17. FIG. 13 is a cross-sectional view when a portion in which the power supply pads 261A and the ground pads 262A that are disposed directly under the dual core processor 80, i.e., disposed directly under a die, are alternately arranged in a grid pattern or a checkered pattern is cut. FIG. 14 is a schematic perspective view showing the first layered capacitor 240A. FIGS. 15 to 17 are cross-sectional views when a portion in which the power supply pads 261 and the ground pads 262 are not alternately arranged is cut.

First, as shown in FIG. 15(a), a substrate 600 in which a built-up portion 30 was provided on a surface of a core substrate was prepared. An interlayer insulating layer 610 (a thermosetting insulating film, manufactured by Ajinomoto Co., Inc., ABF-45SH) was bonded onto the built-up portion 30 using a vacuum laminator under laminating conditions at a temperature in the range of 50° C. to 150° C. and at a pressure in the range of 0.5 to 1.5 MPa. Subsequently, a high-dielectric sheet 620 (produced by the same process as that used for the high-dielectric sheet 520 of the second embodiment) prepared in advance was bonded onto the interlayer insulating layer 610 (which was formed into the interlayer insulating layer 220 shown in FIG. 13) with a vacuum laminator under laminating conditions at a temperature in the range of 50° C. to 150° C. and a pressure in the range of 0.5 to 1.5 MPa and was then dried at 150° C. for one hour (see FIG. 15(b)). Each of copper foils 622 and 626 of the high-dielectric sheet 620 was a solid layer on which no circuits are formed. Subsequently, the high-dielectric sheet 620 was etched by a tenting process. An etchant containing cupric chloride was used in the etching process. The process was performed within a short time such that the copper foil 626 and a high-dielectric layer 624 were completely etched, and the copper foil 622 was then slightly etched (see FIG. 15(c)). In FIG. 15(c), isolated lands 626a (which were formed into the lands 268A shown in FIG. 13) were formed by separating a part of the copper foil 626 by etching. An interlayer insulating layer (which was formed into the interlayer insulating layer 245 shown in FIG. 13, a thermosetting insulating film, manufactured by Ajinomoto Co., Inc., ABF-45SH) 628 was then laminated on the high-dielectric sheet 620 (FIG. 15(d)). Next, through-holes 630 were formed at predetermined positions of the above substrate having the interlayer insulating layer 628 thereon using a carbon dioxide gas laser, a UV laser, a YAG laser, an excimer laser, or the like (see FIG. 15(e)). The through-holes 630 were formed so as to penetrate through the interlayer insulating layer 628, the high-dielectric sheet 620, and the interlayer insulating layer 610 and to reach the surface of a wiring pattern 32 of the built-up portion 30. Regarding the laser conditions, a UV laser device manufactured by Hitachi Via Mechanics, Ltd. was used at an output in the range of 3 to 10 kW, at a frequency in the range of 30 to 60 kHz, and with the number of shots of 54.

After the through-holes 630 were formed, a resin 640 for filling through-holes (prepared by the same process as that used for the resin 532 for filling through-holes of the second embodiment) was filled in the through-holes 630 and then dried (see FIG. 16(a)). Subsequently, through-holes 651, 652, and 653 were formed at predetermined positions of the above substrate using a carbon dioxide gas laser, a UV laser, a YAG laser, an excimer laser, or the like (see FIG. 16(b)). The through-holes 651 were formed so as to penetrate through the resin 640 for filling through-holes and to reach the surface of the wiring pattern 32 of the built-up portion 30. The through-holes 652 were formed so as to penetrate through the interlayer insulating layer 628 and to reach the surface of the copper foil 626. The through-holes 653 were formed so as to penetrate through the interlayer insulating layer 628, the high-dielectric sheet 620 (including the land 626a, the high-dielectric layer 624, and the copper foil 622), and the interlayer insulating layer 610 and to reach the surface of the wiring pattern 32 of the built-up portion 30. Regarding the order of the formation of these through-holes 651, 652, and 653, first, the through-holes 651 were formed, the through-holes 652 were then formed, and lastly, the through-holes 653 were formed. The depths of the through-holes were controlled by changing the type of laser used and the number of laser shots. For example, each of the through-holes 651 was formed using a $CO_2$ laser via a mask diameter of 1.4 mm, at an energy density of 2.0 mj, and a number of shots of 3; each of the through-holes 652 was formed under the same conditions as those used for the through-holes 651 except that the number of shots was changed to 1; and each of the through-holes 653 was formed under the same conditions as those used for the through-holes 651 except that a UV laser was used and the number of shots was changed to 56 (output: 3 to 10 W, frequency: 30 to 60 kHz). The through-holes 630 were formed so as to correspond to not all of the power supply pads 262A shown in FIG. 13 but some of the pads 262A, i.e., the power supply pads 262Ay. The through-holes 653 were formed so as to correspond to not all of the ground pads 261A shown in FIG. 13 but some of the pads 261A, i.e., the ground pads 261Ay.

Drying and curing were then performed at 170° C. for three hours to completely cure the resin 640. Subsequently, a catalyst was applied on the surface of the substrate. By employing a normal semi-additive process, each of the through-holes 651, 652, and 653 was filled with a metal to form rod-shaped conductors 285A, 284A, and 282A, respectively; lands 267Ay, 267Ax, and 266Ay were formed on the rod-shaped conductors 285A, 284A, and 282A, respectively; and a wiring 247A connecting the land 267Ax to the land 267Ay was also formed (see FIG. 16(c)). The wiring pattern 32 of the built-up portion 30 was connected to the copper foil 626 (which was formed into an upper surface electrode 242A) via this wiring 247A. Although not shown in the figure, the land 266Ax and the wiring 246A shown in FIG. 14 were also formed at the same time. Subsequently, a stress relief sheet 670 (which was formed into the stress relief portion 250 shown in FIG. 13, and the production process of which is described in that of the stress relief sheet 550 of the second embodiment) was laminated (see FIG. 16(d)).

Subsequently, through-holes 680 were formed in the stress relief sheet 670 at positions directly on the lands 267Ay, 267Ax, and 266Ay (see FIG. 17(a)). A roughening treatment, a complete curing, a catalyst application, chemical copper plating, the formation of a plating resist, copper electroplating, the removal of the plating resist, and quick etching were then performed to fill each of the through-holes 680 with a metal, and pads were formed on the upper surface of the metal (see FIG. 17(b)). Thus, a rod-shaped conductor 283A and a power supply pad 262Ay were formed on the land 267Ay. A rod-shaped conductor 283A and a power supply pad 262Ax were formed on the land 267Ax. A rod-shaped conductor 281A and a ground pad 261Ay were formed on the land 266Ay. Although not shown in the figure, the rod-shaped conductor 281A and the ground pad 261Ax were also formed on the land 266Ax shown in FIGS. 13 and 14. Thus, the multilayer printed wiring board 210 shown in FIG. 13 was produced. The copper foil 622 corresponds to the lower surface electrode 241A, the copper foil 626 corresponds to the upper surface electrode 242A, and the high-dielectric layer 624 corresponds to the high-dielectric layer 243A. These constitute the first layered capacitor 240A. In the third embodiment, when the ground pads 261Ax are connected to the ground pads 261Ay via any of the layers (for example, on the mounting portion 260), the rod-shaped conductors 281A and the lands 266Ax are not necessary. Similarly, when the pads 262Ax for an electrode are connected to the pads 262Ay for an electrode via any of the layers (for example, on the mounting portion 260), the rod-shaped conductors 283A, the lands 267Ax, and the rod-shaped conductors 284A, which are disposed directly under the power supply pads 262Ax are also not necessary. In such a case, the number of via holes and the number of lands can be decreased.

Subsequently, solder bumps may be formed on each terminal of the mounting portion 260 (see the method of forming solder bumps described in the first embodiment). When a chip capacitor 273A is mounted as shown in FIG. 13, the pads 271A and 272A can be formed as in the second embodiment.

According to the multilayer printed wiring board 210 of the third embodiment described above in detail, the same advantages as those in the above-described first embodiment can be achieved. In addition, in this embodiment, electric charges from an external power supply source are charged from the built-up portion 30 to the high-dielectric sheet 620 through the rod-shaped conductors 285A and 284A without bypassing the first layered capacitor 240. Consequently, the length of a wiring connecting the external power supply source to the upper surface electrode 242A, which is a power supply electrode of the first layered capacitor 240A, and the length of a wiring connecting the external power supply source to the lower surface electrode 241A, which is a ground electrode of the first layered capacitor 240A can be shortened. Therefore, even when a dual core processor 80 (see FIG. 1) that is driven at a high speed is mounted on the mounting portion 260, a shortage of charges of the first layered capacitor 240A does not easily occur. This also applies to the second layered capacitor. In this embodiment, a facing area S between the lower surface electrode 241A and the upper surface electrode 242A was determined so that the capacitance C of the first layered capacitor 240A was 0.5 µF directly under the die. The number of passing holes 245A of the lower surface electrode 241A, the positions of the passing holes 245A, the number of passing holes 244A and 246A of the upper surface electrode 242A, and the positions of the passing holes 244A and 246A were determined on the basis of the facing area S. Herein, the facing area S was calculated from a formula of $C = \in 0 \cdot \in r \cdot d/S$. More specifically, the relative dielectric constant $\in r$ of the high-dielectric layer 242A was 1,850, and the thickness d thereof was 1.2 µm. These values were substituted for the above formula, and 0.5 µF was substituted for the capacitance C. Thus, the facing area S was calculated. In the formula, $\in 0$ represents the dielectric constant (constant) in vacuum.

Figure 18:
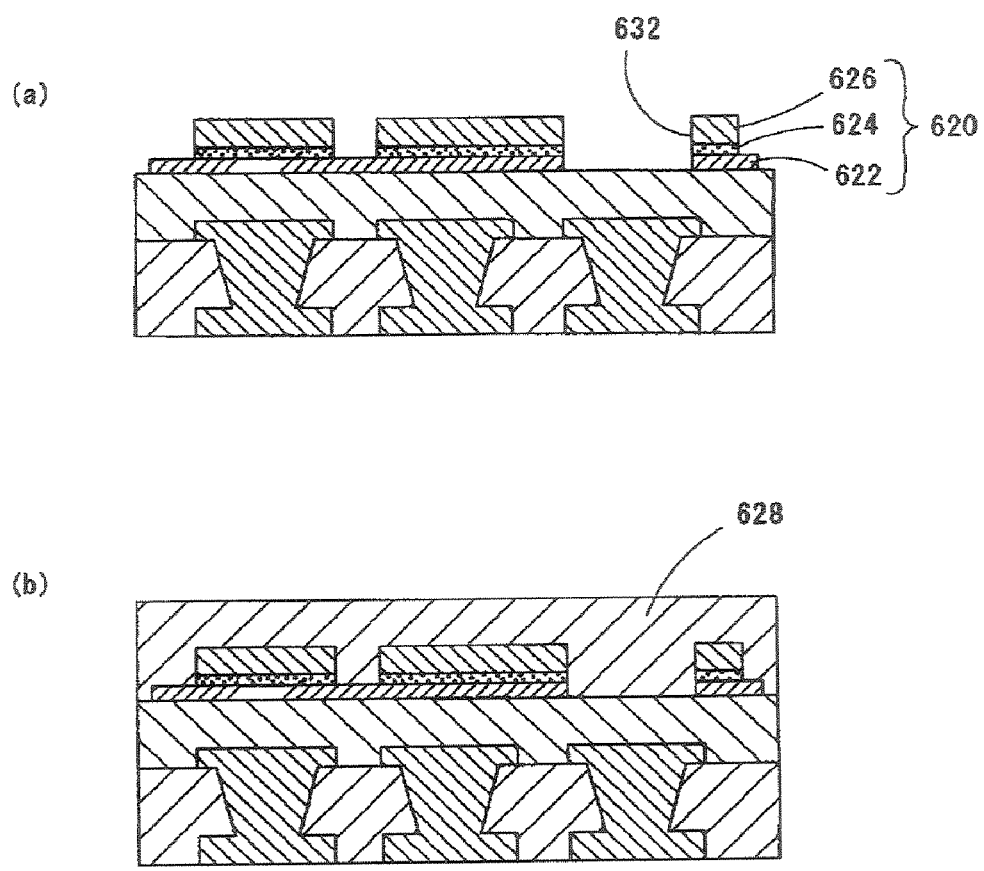
FIG. 18 includes views illustrating a process of producing another multilayer printed wiring board 210.

In the production process described above, after the step shown in FIG. 15(c), the interlayer insulating layer 628 was laminated (see FIG. 15(d)), and the through-holes 630 were formed at predetermined positions of the interlayer insulating layer 628 (see FIG. 15(e)). Subsequently, the through-holes 630 were filled with the resin 640 for filling through-holes, and the resin 640 was then dried (see FIG. 16(a)). Furthermore, the through-holes 651 were formed in the resin 640 for filling through-holes (see FIG. 16(b)). Alternatively, the following process may be employed. Specifically, after the step shown in FIG. 15(c), a commercially available dry film is applied on the surface of the substrate. Subsequently, a part of the high-dielectric sheet 620 disposed at a position where the rod-shaped conductor 285A (see FIG. 16(c)) is to be formed is removed by a tenting process so that the etched area is larger than the area of the rod-shaped conductor 285A, thus forming an expanded hole 632 (see FIG. 18(a)). Subsequently, an interlayer insulating layer 628 is laminated on the high-dielectric sheet 620, and the expanded hole 632 formed by removing the high-dielectric sheet 620 by etching is also filled with the interlayer insulating layer 628. The substrate is then dried (see FIG. 18(b)). The steps of forming the through-holes 651, 652, and 653, and the subsequent steps of the third embodiment may then be performed. In this process, the step of filling the through-holes 630 can be eliminated.

This application claims priority from Japanese Patent Application No. 2005-172444 filed Jun. 13, 2005, which is hereby incorporated by reference herein in its entirety.

Industrial Applicability

The printed wiring board of the present invention is used for mounting a semiconductor device such as an IC chip. For example, the printed wiring board of the present invention can be used in the electrical industry, the telecommunication industry, and the like.

The invention claimed is:

1. A printed wiring board comprising:
   a circuit board structure having a mounting portion on which a single processor chip including a plurality of processor cores is mounted;
   a plurality of power supply lines formed in the circuit board structure and extending to the mounting portion of the circuit board structure such that the power supply lines are connected to the processor cores of the single processor chip, respectively;
   a plurality of ground lines formed in the circuit board structure and extending to the mounting portion of the circuit board structure such that the ground lines are connected to the processor cores of the single processor chip, respectively; and
   a plurality of independent layered capacitors positioned in the circuit board structure and connected to the power supply lines and the ground lines, respectively, such that the independent layered capacitors are connected to the processor cores of the single processor chip through the power supply lines and ground lines, respectively,
   wherein each of the independent layered capacitors comprises a first surface electrode, a second surface electrode and a high-dielectric layer sandwiched between the first surface electrode and the second surface electrode, one of the first surface electrode and the second surface electrode of each of the independent layered capacitors is connected to a respective one of the power supply lines and the other one of the first surface electrode and the second surface electrode is connected to a respective one of the ground lines.

2. The printed wiring board according to claim 1, wherein the high-dielectric layer of each of the independent layered capacitors is made of a ceramic prepared by sintering a high-dielectric material.

3. The printed wiring board according to claim 1, wherein the high-dielectric layer of each of the independent layered capacitors is made of a ceramic prepared by sintering a raw material comprising at least one metal oxide selected from the group consisting of barium titanate, strontium titanate, tantalum oxide, lead zirconate titanate, lead lanthanum zirconate titanate, lead niobium zirconate titanate, lead calcium zirconate titanate, and lead strontium zirconate titanate.

4. The printed wiring board according to claim 1, further comprising:
   a plurality of pads for the first surface electrode of each of the independent layered capacitors; and
   a plurality of pads for the second surface electrode of each of the independent layered capacitors,
   wherein the pads for the second surface electrode comprise a plurality of directly-connected-type pads each of which is electrically connected to a rod-shaped conductor penetrating through the first surface electrode in a non-contact manner and reaching the second surface electrode, and a plurality of indirectly-connected-type pads each of which is electrically connected to the directly-connected-type pads via a connection conductor.

5. The printed wiring board according to claim 1, further comprising:
   a plurality of pads for the second surface electrode of each of the independent layered capacitors; and
   a plurality of rod-shaped conductors that electrically connect the second surface electrode of each of the independent layered capacitors to the respective one of the power supply lines or the ground lines provided below the second surface electrode of each of the independent layered capacitors,
   wherein a number of the rod-shaped conductor is smaller than a number of the pads for the second surface electrode.

6. The printed wiring board according to claim 1, further comprising:
   a plurality of pads for the first surface electrode of each of the independent layered capacitors;
   a plurality of pads for the second surface electrode of each of the independent layered capacitors; and
   a plurality of rod-shaped conductors that penetrate from the first surface electrode of each of the independent layered capacitors through the second surface electrode of each of the independent layered capacitors in a non-contact manner and that electrically connect to the respective one of the power supply lines or the ground lines provided below the second surface electrode,
   wherein a number of the rod-shaped conductors is smaller a number of the pads for the first surface electrode.

7. The printed wiring board according to claim 1, wherein the first and second surface electrodes of each of the layered capacitors are separated by a distance of 10 μm or less.

8. The printed wiring board according to claim 1, wherein each of the independent layered capacitors is provided directly under a respective one of the processor cores.

9. The printed wiring board according to claim 1, further comprising:
   a plurality of chip capacitors positioned adjacent to the mounting portion of the circuit board structure,
   wherein the chip capacitors are independently connected to the independent layered capacitors, respectively.

10. The printed wiring board according to claim 1, wherein the circuit board structure has a stress relief portion formed below the mounting portion, and the stress relief portion is made of an elastic material.

11. The printed wiring board according to claim 10, wherein the stress relief portion is formed only in an area directly under the single processor chip mounted on the mounting portion.

12. The printed wiring board according to claim 10, wherein the elastic material of the stress relief portion comprises at least one organic resin sheet selected from the group consisting of a modified epoxy resin sheet, a polyphenylene ester resin sheet, a polyimide resin sheet, a cyanoester resin sheet, and an imide resin sheet.

13. The printed wiring board according to claim 12, wherein the organic resin sheet comprises at least one resin selected from the group consisting of a thermoplastic resin, a thermosetting resin, and a rubber resin, the thermoplastic resin is at least one of a polyolefin resin and a polyimide resin, the thermosetting resin is a silicone resin, and the rubber resin is at least one of SBR, NBR and urethane.

14. The printed wiring board according to claim 12, wherein the organic resin sheet comprises a resin and at least one inorganic material added to the resin, and the at least one inorganic material is selected from the group consisting of silica, alumina, and zirconia.

15. The printed wiring board according to claim 10, wherein the stress relief portion has a Young's modulus in a range of 10 to 1,000 MPa.

* * * * *